US009793909B2

(12) United States Patent
Kim et al.

(10) Patent No.: US 9,793,909 B2
(45) Date of Patent: Oct. 17, 2017

(54) ANALOG-TO-DIGITAL CONVERTER, INCLUDING SYNCHRONIZED CLOCKS, IMAGE SENSOR INCLUDING THE SAME AND METHOD OF OPERATING IMAGE SENSOR WHEREIN EACH SYNCHRONIZATION CIRCUIT TO PROVIDE SYNCHRONIZED INPUT CLOCK SIGNALS FOR EACH COUNTER GROUP

(71) Applicant: Samsung Electronics Co., Ltd., Suwon-si (KR)

(72) Inventors: Kyung-Min Kim, Seoul (KR); Jin-Woo Kim, Seoul (KR); Sung-Ho Suh, Hwaseong-si (KR); Hee-Sung Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 418 days.

(21) Appl. No.: 14/501,476

(22) Filed: Sep. 30, 2014

(65) Prior Publication Data
US 2015/0188559 A1    Jul. 2, 2015

(30) Foreign Application Priority Data
Dec. 31, 2013 (KR) .................... 10-2013-0168048

(51) Int. Cl.
*H04N 5/378*    (2011.01)
*H03M 1/12*    (2006.01)
*H03M 1/56*    (2006.01)

(52) U.S. Cl.
CPC .............. *H03M 1/12* (2013.01); *H04N 5/378* (2013.01); *H03M 1/123* (2013.01); *H03M 1/56* (2013.01)

(58) Field of Classification Search
CPC ........ H04N 21/4305; H04N 5/04; H04N 5/06; H04N 5/378; H03M 1/0624; H03M 1/12
USPC .......................................... 250/208.1, 214 R
See application file for complete search history.

(56) References Cited

U.S. PATENT DOCUMENTS

| 7,088,632 | B2 | 8/2006 | Pelley |
| 7,324,033 | B2* | 1/2008 | Asayama ............ H03M 1/0863 341/144 |
| 7,814,359 | B2 | 10/2010 | Bae et al. |
| 7,973,695 | B2* | 7/2011 | Kudo ..................... H03K 4/02 341/155 |
| 8,102,449 | B2 | 1/2012 | Kudo |
| 8,351,283 | B2 | 1/2013 | Shinozaki et al. |

(Continued)

FOREIGN PATENT DOCUMENTS

| CN | 102035539 | 4/2011 |
| KR | 100917616 | 9/2009 |

*Primary Examiner* — Que T Le
(74) *Attorney, Agent, or Firm* — Onello & Mello, LLP.

(57) ABSTRACT

An image sensor includes a pixel array, a plurality of comparators, a plurality of counters and a plurality of synchronization circuits. The pixel array includes a plurality of pixels configured to generate analog signals by sensing incident light. The comparators generate comparison signals by comparing the analog signals with a reference signal. The counters are grouped into a plurality of counter groups. Each of the counters generates digital signals corresponding to the analog signals by counting, the counting terminated by the comparison signals. Each of the synchronization circuits synchronizes input clock signals to a source clock signal to provide synchronized input clock signals to each of the counter groups.

20 Claims, 30 Drawing Sheets

(56) References Cited

U.S. PATENT DOCUMENTS

2009/0122632 A1 5/2009 Kwak et al.
2011/0074968 A1 3/2011 Kim et al.
2013/0061083 A1 3/2013 Ding et al.

* cited by examiner

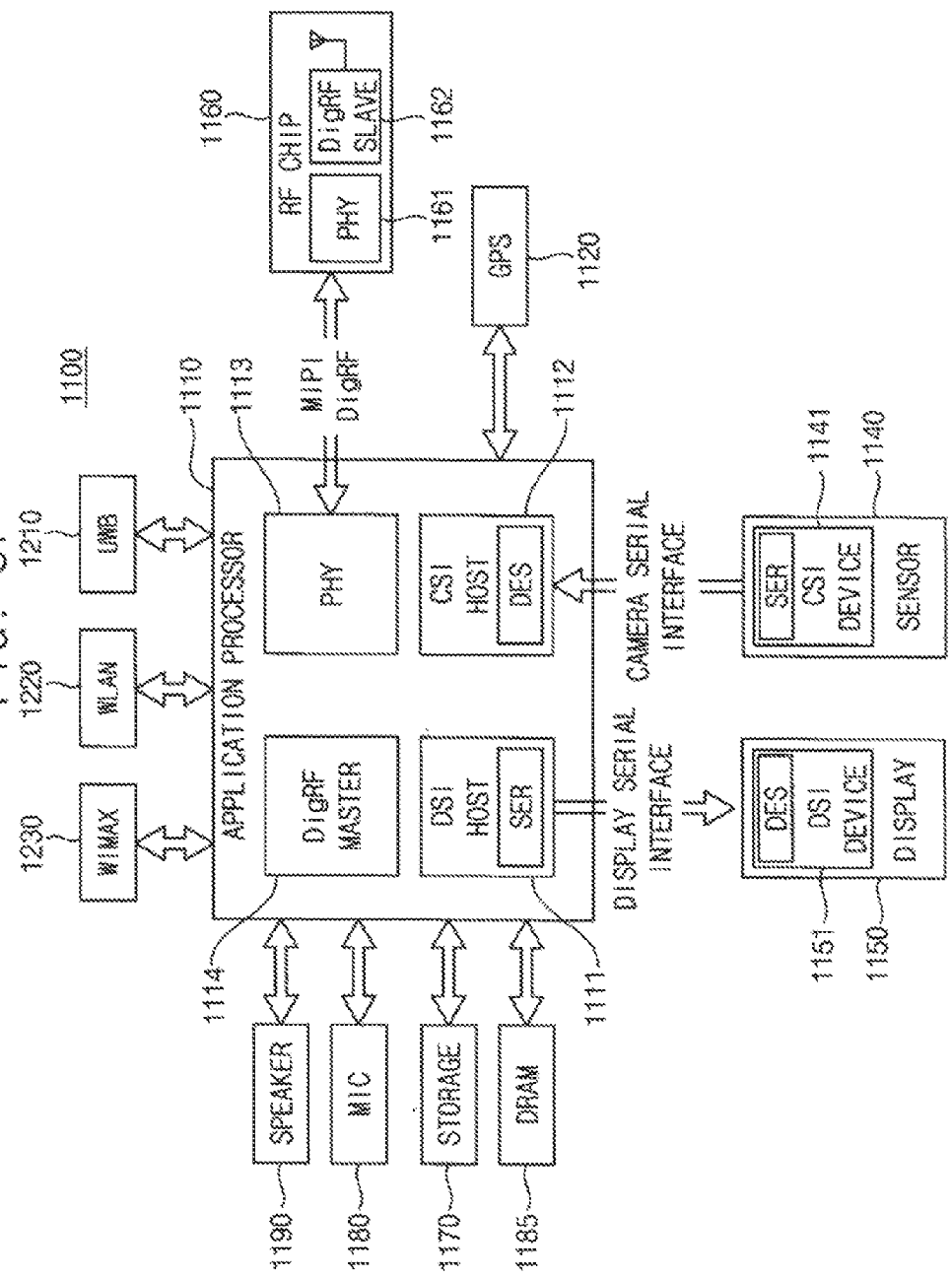

ANALOG-TO-DIGITAL CONVERTER, INCLUDING SYNCHRONIZED CLOCKS, IMAGE SENSOR INCLUDING THE SAME AND METHOD OF OPERATING IMAGE SENSOR WHEREIN EACH SYNCHRONIZATION CIRCUIT TO PROVIDE SYNCHRONIZED INPUT CLOCK SIGNALS FOR EACH COUNTER GROUP

CROSS-REFERENCE TO RELATED APPLICATION

This U.S. Non-provisional application claims priority under 35 USC §119 to Korean Patent Application No. 10-2013-0168048, filed on Dec. 31, 2013, in the Korean Intellectual Property Office (KIPO), the disclosure of which is incorporated by reference in its entirety herein.

BACKGROUND

1. Technical Field

Exemplary embodiments in accordance with principles of inventive concepts relate generally to semiconductor integrated circuits, and more particularly to an analog-to-digital converter, an image sensor including the analog-to-digital converter and a method of operating an image sensor.

2. Discussion of the Related Art

Counters may be used in various electronic circuits, such as analog-to-digital converters (ADCs), for example. ADCs may, in turn, be used in devices for converting physical quantities such as light intensity, sound intensity, time, etc. into a digital signal. For exemplary, an image sensor, which captures images based on characteristics of semiconductor responding to intensity of incident lights, may include an analog-to-digital converter (ADC) for converting analog signals from a pixel array into digital signals. The ADC may include one or more counters that perform counting operation based on a clock signal.

Operation speed and power consumption of the counter may directly affect the performance of a device and/or a system including the counter. A complementary metal oxide semiconductor (CMOS) image sensor may include a relatively large number of counters to convert analog signals, which are output column by column from an active pixel sensor array, into digital signals. The number of counters increases as resolution of the image sensor increases. Unfortunately, as the number of counters increases and as the operational frequency of the image sensor increases in order to provide improved imaging, mismatches due to propagation delays of clock signals may degrade the operation of associated imaging devices.

SUMMARY

In exemplary embodiments in accordance with principles of inventive concepts, an image sensor includes a pixel array including a plurality of pixels configured to generate analog signals by sensing incident lights; a plurality of comparators configured to generate comparison signals by comparing the analog signals with a reference signal; a plurality of counters that are grouped into a plurality of counter groups, each of the counters configured to generate digital signals corresponding to the analog signals by counting under control of the comparison signals and a plurality of input clock signals; and a plurality of synchronization circuits, configured to synchronize the input clock signals in response to a source clock signal to provide synchronized input clock signals to the counter groups.

In exemplary embodiments in accordance with principles of inventive concepts, input clock signals have the same frequency, but phase differences with respect to one another.

In exemplary embodiments in accordance with principles of inventive concepts each of the counters is configured to count four or more times per cyclic period of the input clock signals, using phase differences of the input clock signals.

In exemplary embodiments in accordance with principles of inventive concepts the source clock signal has a frequency higher than the identical frequency of the input clock signals.

In exemplary embodiments in accordance with principles of inventive concepts the synchronization circuits include a plurality of retimers that are cascade-coupled to sequentially transfer the input clock signals in response to the source clock signal.

In exemplary embodiments in accordance with principles of inventive concepts, each of the retimers is configured to receive the input clock signals from a main clock generator or the previous retimer and configured to rearrange the received input clock signals in response to the source clock signal to generate the synchronized input clock signals.

In exemplary embodiments in accordance with principles of inventive concepts, synchronization circuits include a plurality of local clock generators, each of the local clock generators configured to generate the input clock signals in response to the source clock signal.

In exemplary embodiments in accordance with principles of inventive concepts, an image sensor includes a source clock transfer circuit configured to buffer the source clock signal to provide each of enforced source clock signals to each of the synchronization circuits.

In exemplary embodiments in accordance with principles of inventive concepts, the source clock transfer circuit includes a plurality of inverters that are cascade-coupled with regular spacing.

In exemplary embodiments in accordance with principles of inventive concepts, the input clock signals include a first input clock signal and a second input clock signal having the same frequency, and wherein the phase of the second input clock signal lags behind the phase of the first input clock signal by 90 degrees.

In exemplary embodiments in accordance with principles of inventive concepts, each of the synchronization circuits includes a first flip-flop including a data terminal receiving the first input clock signal, a clock terminal receiving the source clock signal and an output terminal generating a first synchronized input clock signal; and a second flip-flop including a data final receiving the second input clock signal, a clock terminal receiving an inversion signal of the source clock signal and an output terminal generating a second synchronized input clock signal.

In exemplary embodiments in accordance with principles of inventive concepts, an image sensor includes synchronization circuits that includes a first toggling flip-flop configured to generate the first input clock signal in synchronization with rising edges of the source clock signal; and a second toggling flip-flop configured to generate the second input clock signal in synchronization with falling edges of the source clock signal.

In exemplary embodiments in accordance with principles of inventive concepts, each of the counters is configured to count four times per cyclic period of the first and second input clock signals, using a phase difference of the first and second input clock signals.

In exemplary embodiments in accordance with principles of inventive concepts, input clock signals include a first input clock signal, a second input clock signal, a third input clock signal and a fourth input clock signal having the same frequency, and wherein a phase of the second input clock signal lags behind a phase of the first input clock signal by 45 degrees, a phase of the third input clock signal lags behind the phase of the second input clock signal by 45 degrees, and a phase of the fourth input clock signal lags behind the phase of the third input clock signal by 45 degrees.

In exemplary embodiments in accordance with principles of inventive concepts, each of the synchronization circuits includes: a first toggling flip-flop configured to generate a first toggling signal in synchronization with rising edges of the source clock signal; a second toggling flip-flop configured to generate a second toggling signal in synchronization with falling edges of the source clock signal; a third toggling flip-flop configured to generate the first input clock signal in synchronization with rising edges of the first toggling signal; a fourth toggling flip-flop configured to generate the second input clock signal in synchronization with rising edges of the second toggling signal; a fifth toggling flip-flop configured to generate the third input clock signal in synchronization with falling edges of the first toggling signal; and a sixth toggling flip-flop configured to generate the fourth input clock signal in synchronization with falling edges of the second toggling signal.

In exemplary embodiments in accordance with principles of inventive concepts each of the counters is configured to use phase differences among the first through fourth input clock signals to count eight times per cyclic period of the first through fourth input clock signals.

In exemplary embodiments in accordance with principles of inventive concepts, each of the counters includes; a buffer unit configured to generate a plurality of gray code bit signals by latching the input clock signals in response to each of the comparison signals indicating the end of the counting operation; and a ripple counter configured to generate more significant bit signals of a count value in response to a latch output signal, the latch output signal corresponding to one of the gray code bit signals.

In exemplary embodiments in accordance with principles of inventive concepts, each of the counters further includes; a code converter configured to perform a logical operation on the gray code bit signals to generate less significant bit signals of the count value.

In exemplary embodiments in accordance with principles of inventive concepts, a buffer unit includes: a plurality of flip-flops, each of the flip-flops including a data terminal receiving each of the input clock signals, a clock terminal receiving each of the comparison signals and an output terminal generating each of the gray code bit signals.

In exemplary embodiments in accordance with principles of inventive concepts, input clock signals include a first input clock signal and a second input clock signal having the same frequency, wherein a phase of the second input clock signal lags behind a phase of the first input clock signal by 90 degrees, and wherein each of the counters is configured to generate first and second gray code bit signals corresponding to less significant bit signals of the counter value, using a phase difference of the first and second input clock signals.

In exemplary embodiments in accordance with principles of inventive concepts, input clock signals include first and second input clock signals having the same frequency, wherein a phase of the second input clock signal lags behind a phase of the first input clock signal by 45 degrees, a phase of the third input clock signal lags behind the phase of the second input clock signal by 45 degrees, and a phase of the fourth input clock signal lags behind the phase of the third input clock signal by 45 degrees, and wherein each of the counters is configured to generate first through fourth gray code bit signals corresponding to less significant bit signals of the counter value, using phase differences of the first through fourth input clock signals.

In exemplary embodiments in accordance with principles of inventive concepts an analog-to-digital converter includes a plurality of counters that are grouped into a plurality of counter groups, each of the counters configured to generate digital signals corresponding to the analog signals by counting under control of a plurality of input clock signals; and a plurality of synchronization circuits configured to synchronize the input clock signals in response to a source clock signal to provide synchronized input clock signals to the counter groups.

In exemplary embodiments in accordance with principles of inventive concepts, wherein the input clock signals have the same frequency, but phase differences with respect to one another.

In exemplary embodiments in accordance with principles of inventive concepts, a method of operating an image sensor includes generating analog signals by sensing incident lights; generating comparison signals by comparing the analog signals with a reference signal; generating digital signals corresponding to the analog signals using counters, each of the counters configured to count under control of the comparison signals and a plurality of input clock signals; grouping the counters into a plurality of counter banks; and synchronizing the input clock signals with a source clock signal using a plurality of synchronization circuits, each of the synchronization circuits corresponding to a counter bank, to provide the synchronized input clock signals to each of the counter banks.

In exemplary embodiments in accordance with principles of inventive concepts, an analog-to-digital converter (ADC), includes a group of counters, each of which is configured to count until a respective count termination signal is activated, wherein each count termination signal is responsive to a comparison between an analog signal and a reference signal; and a clock synchronizing circuit configured to generate counting signals for the counters, wherein all of the counting signals are of the same frequency, but at least two of the counting signals have different phases from one another and the counting signals are of a lower frequency than a synchronizing clock signal to which the clock synchronizing circuit synchronizes the counting signals.

In exemplary embodiments in accordance with principles of inventive concepts, the reference signal is a ramp signal.

In exemplary embodiments in accordance with principles of inventive concepts, the counters output gray code counts.

In exemplary embodiments in accordance with principles of inventive concepts, the counters are multiple data rate (MDR) counters.

In exemplary embodiments in accordance with principles of inventive concepts, an imager includes a pixel array configured to collect light in the respective pixels and to generate for each pixel an analog signal representative of light collected within the pixel; a group of counters, each of which is configured to count until a respective count termination signal is activated, wherein each count termination signal is responsive to a comparison between an analog signal representative of light collected within a pixel and a reference signal; and a clock synchronizing circuit configured to generate counting signals for the counters, wherein all of the counting signals are of the same frequency, but at least two of the counting signals have different phases from one another and the counting signals are of a lower frequency than a synchronizing clock signal to which the clock synchronizing circuit synchronizes the counting signals.

In exemplary embodiments in accordance with principles of inventive concepts, an imager includes a reference signal that is a ramp signal.

In exemplary embodiments in accordance with principles of inventive concepts, an imager includes counters that output gray code counts.

In exemplary embodiments in accordance with principles of inventive concepts, an imager includes counters that are multiple data rate (MDR) counters.

In exemplary embodiments in accordance with principles of inventive concepts, a portable electronic device includes an imager that includes a pixel array configured to collect light in the respective pixels and to generate for each pixel an analog signal representative of light collected within the pixel; a group of counters, each of which is configured to count until a respective count termination signal is activated, wherein each count termination signal is responsive to a comparison between an analog signal representative of light collected within a pixel and a reference signal; and a clock synchronizing circuit configured to generate counting signals for the counters, wherein all of the counting signals are of the same frequency, but at least two of the counting signals have different phases from one another and the counting signals are of a lower frequency than a synchronizing clock signal to which the clock synchronizing circuit synchronizes the counting signals.

In exemplary embodiments in accordance with principles of inventive concepts a smart phone includes an imager with a pixel array configured to collect light in the respective pixels and to generate for each pixel an analog signal representative of light collected within the pixel; a group of counters, each of which is configured to count until a respective count termination signal is activated, wherein each count termination signal is responsive to a comparison between an analog signal representative of light collected within a pixel and a reference signal; and a clock synchronizing circuit configured to generate counting signals for the counters, wherein all of the counting signals are of the same frequency, but at least two of the counting signals have different phases from one another and the counting signals are of a lower frequency than a synchronizing clock signal to which the clock synchronizing circuit synchronizes the counting signals.

BRIEF DESCRIPTION OF THE DRAWINGS

Exemplary embodiments of inventive concepts will be more clearly understood from the following detailed description taken in conjunction with the accompanying drawings.

FIG. 37 illustrates a block diagram of an interface employable in the computing system of FIG. 36 according to some exemplary embodiments.

DETAILED DESCRIPTION OF THE EMBODIMENTS

Figure 1:
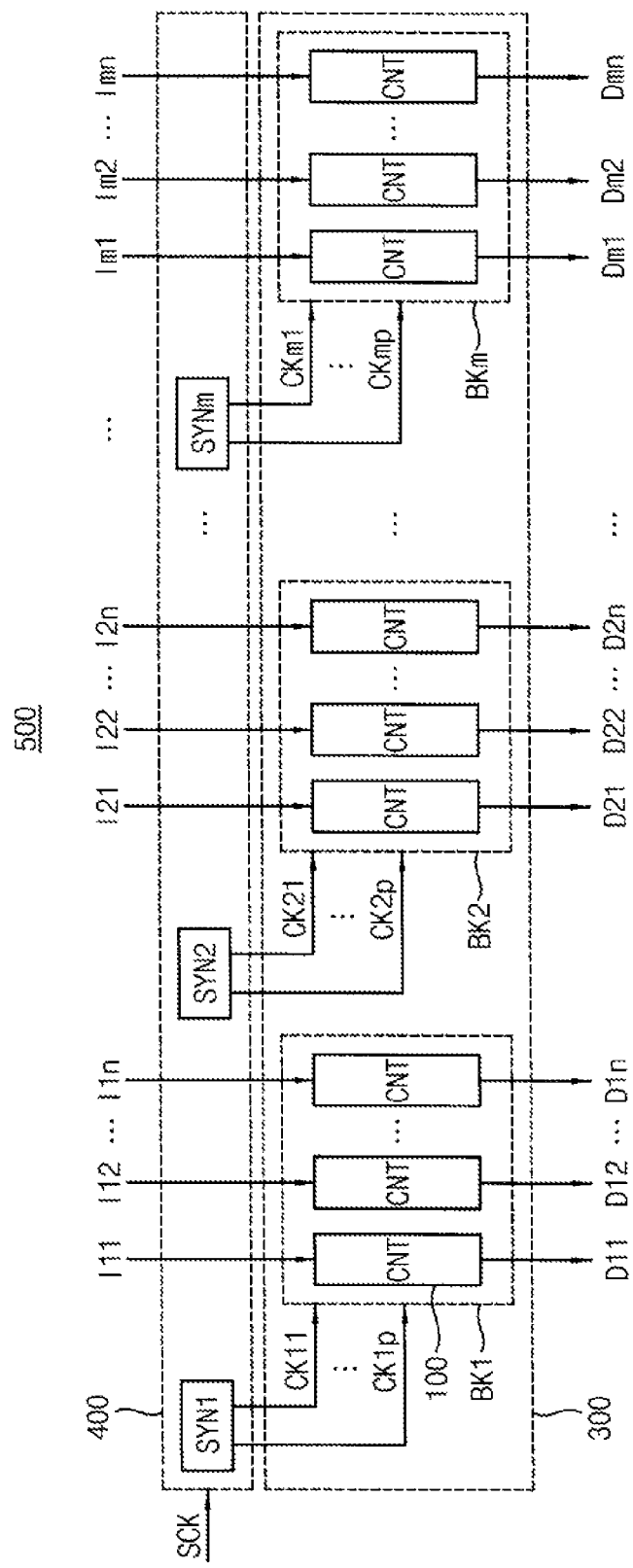
FIG. 1 is a block diagram illustrating an analog-to-digital converter according to exemplary embodiments.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an exemplary embodiment of an analog-to-digital converter 500 in accordance with principles of inventive concepts, which includes a counter array 300 and a clock supply circuit 400.

In this exemplary embodiment counter array 300 includes a plurality of counters CNTs. Each counter 100 generates one each of digital signals D11 through Dmn corresponding to each of analog signals I11 through Imn by performing a counting operation based on a plurality of input clock signals CKi1 through CKip, where m, n and p are positive integers and p is a positive integer from 1 to m. For exemplary, the analog signals I11 through Imn may be signals provided from comparators COMs included in an image sensor 800 of FIG. 28. The analog signals I11 through Imn may be signals that transition at respective termination time points of the counting operation. In exemplary embodiments in accordance with principles of inventive concepts, signals I11 through Imn, which may be referred to herein as "count termination" or "stop count" signals, may transition when the value of a reference signal, which may be a ramp voltage, equals the value of a signal representative of accumulated light within a pixel of an imaging device. In such exemplary embodiments the "termination time point of the counting operation" is not a fixed time, but the time at which the reference voltage equals the respective image pixel signal voltage. In exemplary embodiments in accordance with principles of inventive concepts, counter input clocks, used to advance counters, may be synchronized using a source clock (for example, SCK), also referred to herein as a synchronizing clock, that operates at a higher frequency than the input clocks (for example, CK11 through CKmn). Counter input clocks may operate at the same frequency but with phase differences among them that enables multiple data rate counting.

In this exemplary embodiment, counters CNTs are grouped into a plurality of counter banks BK1 through BKm. For example, as illustrated in FIG. 1, the counters CNTs may be grouped into m counter banks, BK1 through BKm, and n counters may be included in each counter bank. Although, in the exemplary embodiment illustrated in FIG. 1 counter banks BK1 through BKm include the same number of counters, the number of counters in the respective counter banks may be different in other exemplary embodiments.

The clock supply circuit 400 includes a plurality of synchronization circuits SYN1 through SYNm. Each synchronization circuit SYNi synchronizes the input clock signals in response to a source clock signal SCK in order to provide the synchronized input clock signals CKi1 through CKip to each counter group BKi. The input clock signals CK11 through CK1p synchronized by the first synchronization circuit SYN1 are provided to the first counter bank BK1, the input clock signals CK21 through CK2p synchronized by the second synchronization circuit SYN2 are provided to the second counter bank BK2, and the input clock signals CKm1 through CKmp synchronized by the second synchronization circuit SYNm are provided to the second counter bank BKm.

As described below in the discussion related to FIGS. 5, 22 and 24, the input clock signals CKi1 through CKip may have the same frequency and respective phases different from each other. The analog-to-digital converter 500 according to exemplary embodiments has the configuration to provide exact phase differences between the input clock signals CKi1 through CKip, which are used in a multiple data rate (MDR) counting operation employing a phase-division scheme. As the number of the counters and their operational frequency increase, mismatches due to propagation delays of the clock signals could degrade performance. However, in exemplary embodiments in accordance with principles of inventive concepts, synchronized input clock signals CKi1 through CKip are provided to each counter bank BKi using the synchronization circuits SYN1 through SYNm to ensure exact, accurate, counting and to thereby avoid performance degradations that might otherwise occur due to mismatches of clock signals which may be due to, for example, differences in propagation delays.

In addition, as described in greater detail below in the discussion related to FIGS. 5, 22 and 24, in exemplary embodiments the source clock signal SCK has a frequency higher than the input clock signals CKi1 through CKip. By operating the counters at a lower frequency, using the lower frequency input clock signals CKi1 through CKip, and using the higher-frequency source clock SCK only to synchronize clock signals CKi1 through CKip, an electronic device in accordance with principles of inventive concepts may reduce power consumption. Additionally, in accordance with principles of inventive concepts, the speed of the counting operation may be readily increased because limits to the frequency of the input clock signals are relieved by separating the source clock signal SCK and the input clock signals (for example, CKi1 through Ckip).

Figure 2:
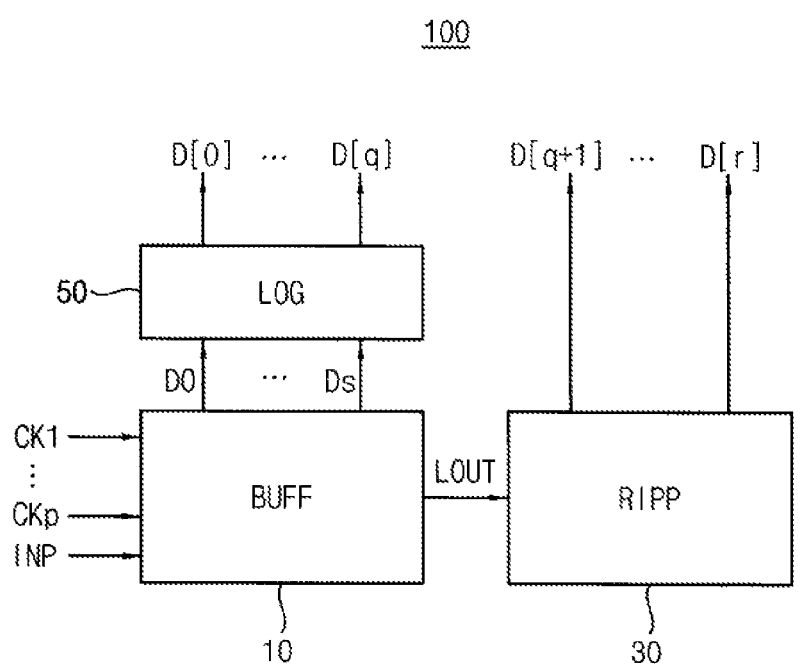
FIG. 2 is a block diagram illustrating a counter included in the analog-to-digital converter of FIG. 1.

FIG. 2 is a block diagram illustrating an exemplary embodiment of a counter 100 such as may be included in the analog-to-digital converter of FIG. 1. In this exemplary embodiment in accordance with principles of inventive concepts, the analog-to-digital converter is a gray-code converter. Counter 100 may include a buffer unit (BUFF) 10 and a ripple counter (RIPP) 30. The buffer unit generates a plurality of gray bit signals D0 through Ds by latching the input clock signals CK1 through CKp in response to an input signal indicating a termination time point of a counting operation (that is, for example, the termination of an accumulation period). Because, in the following exemplary embodiments, the "termination time point of a counting operation" generally corresponds to the end of a signal accumulation period, the termination time point of a counting operation will be referred to as the end of a signal accumulation period hereinafter. The ripple counter 30 generates more significant bit signals D[q+1] through D[r] of a count value D[0:r] in response to a latch output signal LOUT. The latch output signal LOUT may correspond to one of the gray bit signals D0 through Ds.

Figure 6:
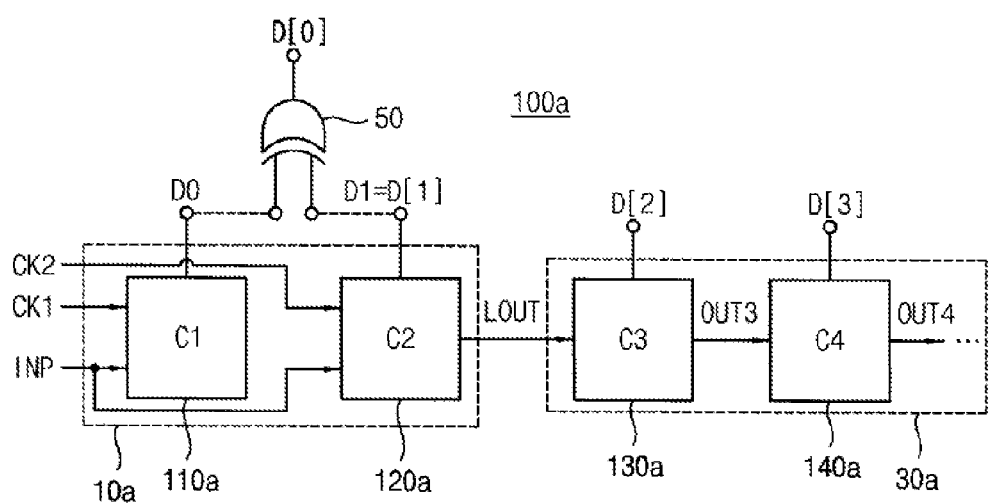
FIG. 6 is a block diagram illustrating a counter of a phase-division scheme according to an exemplary embodiment.

The counter 100 may further include a code converter (LOG) 50 that performs a logical operation on the gray bit signals D0 through Ds to generate less significant bit signals D[0] through D[q] of the count value D[0:r]. For exemplary, the code converter 50 may be implemented with an XOR logic gate as illustrated in FIG. 6. The gray bit signals D0 through Ds represent not a binary code but a gray code. However, the gray code itself may represent the valid counting result and the gray code may be converted to the binary code using the code converter 50. In exemplary embodiments in accordance with principles of inventive concepts, less significant bit signals D[0] through D[q] are not toggling during the counting operation, and the less significant bit signals D[0] through D[q] may be provided by performing a logic operation on the latched gray bit signals D0 through Ds after the counting operation is terminated. Accordingly, the code converter 50 may be disposed out of, or separate from, the counter 100 and, in exemplary embodiments in accordance with principles of inventive concepts, code converter 50 is located in a separate integrated circuit, or chip, from that of counter 100. The number s of the gray bit signals D0 through Ds may be identical to or different from the number q of the less significant bit signals D[0] through D[q].

The counter 100 performs the MDR counting operation using a phase-division scheme, that is, using the phase differences of the input clock signals CK1 through CKp. Exemplary configurations of the counter 100 in accordance with principles of inventive concepts will be described in greater detail in the discussion related to FIGS. 6 through 19, 25 and 26.

Figure 3:
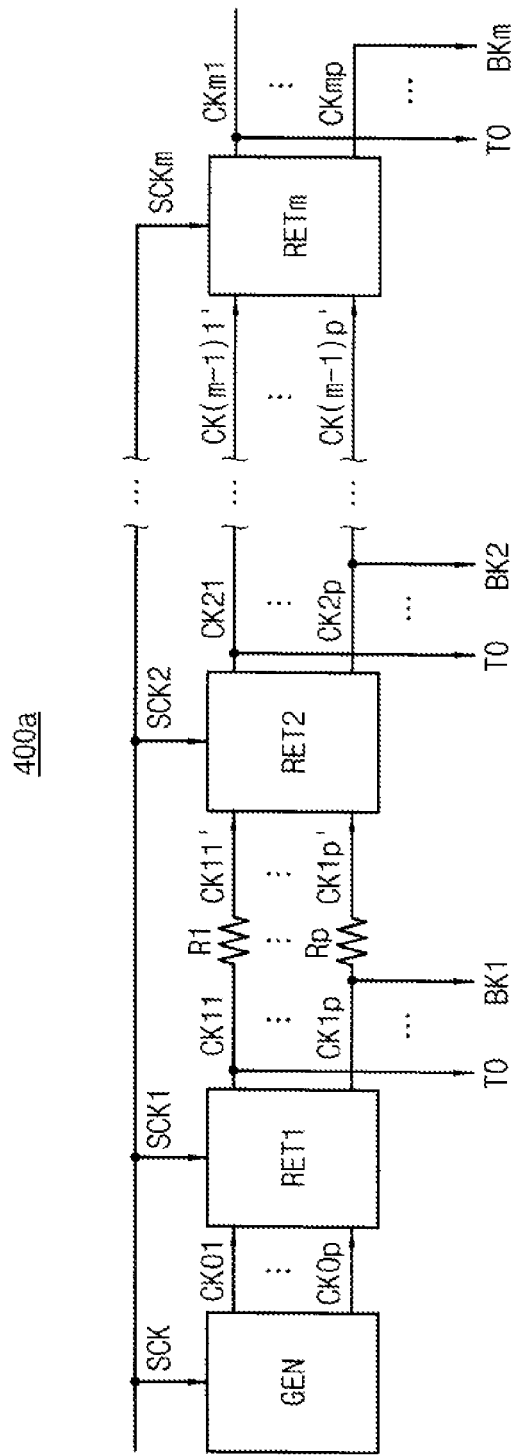
FIG. 3 is a block diagram illustrating an exemplary embodiment of a clock supply circuit included in the analog-to-digital converter of FIG. 1.

FIG. 3 is a block diagram illustrating an exemplary embodiment of a clock supply circuit in accordance with principles of inventive concepts, such as may be included in the analog-to-digital converter of FIG. 1. Clock supply circuit 400a may include a main clock generator GEN and a plurality of retimers RET1 through RETm. The main clock generator GEN generates input clock signals CK01 through CK0p in response to, or derived from, a source clock signal SCK. The retimers RET1 through RETm are cascade-coupled to sequentially transfer the input clock signals CKi1 through CKip in response to the source clock signal SCKi (i=1, 2, . . . , m). The retimers RET1 through RETm correspond to the synchronization circuits SYN1 through SYNm in FIG. 1. The synchronized input clock signals CKi1 through CKip are provided to the corresponding counter bank BKi.

Each retimer RETi receives the input clock signals CK(i−1)1 through CK(i−1)p from the main clock generator GEN or the previous retimer RET(i−1) and rearranges the received input clock signals CK(i−1)1 through CK(i−1)p in response to the source clock signal SCKi to generate the synchronized input clock signals CKi1 through CKip.

For example, the first retimer RET1 may receive the input clock signals CK01 through CK0p from the main clock generator GEN and rearrange, or synchronize, the input clock signals CK01 through CK0p in response to the source clock signal SCK1 to generate the synchronized input clock signals CK11 through CK1p. That is, the first retimer RET1 may use the source clock signal SCK1 to synchronize input clock signals CK01 through CK0p. The input clock signals CK01 through CK0p, which are generated from the main clock generator GEN and provided to the first retimer RET1, may have negligible mismatches because the input clock signals CK01 through CK0p are provided to no counter bank. As a result, in some exemplary embodiments, the first retimer RET1 may be omitted and the input clock signals CK01 through CK0p from the main clock generator GEN may be provided directly to the first counter bank BK1.

The second retimer RET2 may receive the input clock signals CK11' through CK1p' from the previous, that is, first retimer, and synchronize them using source clock signal SCK2 to generate the synchronized input clock signals CK21 through CK2p. The synchronized input clock signals CK11 through CK1p from the first retimer RET1 may be provided to the first counter bank BK1, and the input clock signals CK11' through CK1p' reaching the second retimer RET2 may have considerable mismatches due to impedance mismatches on their respective paths, each of which is represented by a respective resistance R1 through Rp on the transmission lines. The second retimer RET2 may synchronize the mismatched input clock signals CK11' through CK1p' using source clock signal SCK1 to generate the synchronized input clock signals CK21 through CK2p. The synchronized input clock signals CK21 through CK2p may be provided to the second counter bank BK2.

Similarly, the last retimer RETm may receive the input clock signals CK(m−1)1' through CK(m−1)p' from the previous retimer RETm−1 and synchronize the input clock signals CK(m−1)1' through CK(m−1)p' using source clock signal SCKm to generate the synchronized input clock signals CKm1 through CKmp, which are provided to the m-th counter bank BKm.

Figure 4:
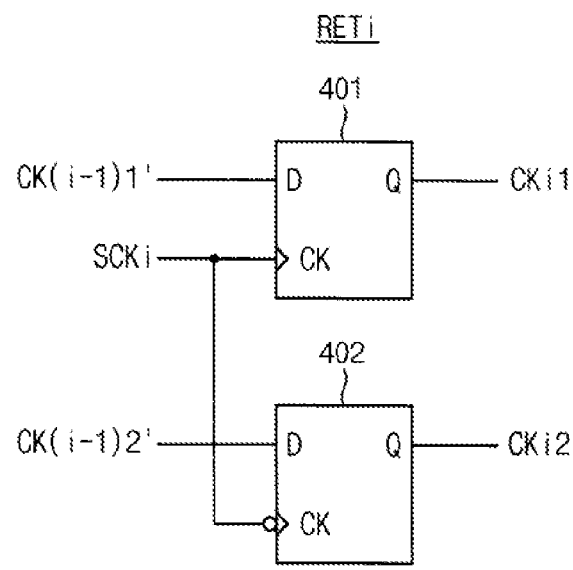
FIG. 4 is a diagram illustrating an exemplary embodiment of a retimer included in the clock supply circuit of FIG. 3.
Figure 5:
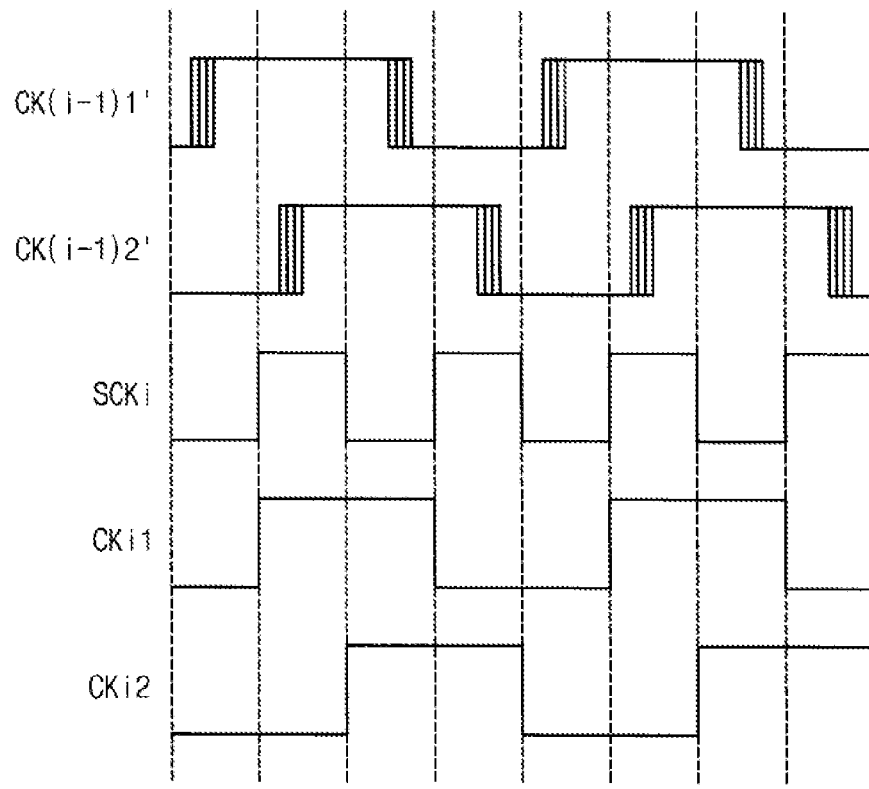
FIG. 5 is a timing diagram illustrating an exemplary operation of the retimer of FIG. 4.

FIG. 4 is a diagram illustrating an exemplary embodiment of a retimer in accordance with principles of inventive concepts such as may be included in the clock supply circuit of FIG. 3, and FIG. 5 is a timing diagram illustrating an exemplary operation of the retimer of FIG. 4.

FIGS. 4 and 5 illustrate an exemplary embodiment in accordance with principles of inventive concepts in which the number of the input clock signals is two and input clock signals include a first input clock signal CK1 and a second input clock signal CK2 having the same frequency. In this exemplary embodiment, the phase of the second input clock signal CK2 may lag behind the phase of the first input clock signal CK1 by 90 degrees.

As illustrated in FIG. 4, each retimer RETi, that is, each synchronization circuit, may include a first flip-flop 401 and a second flip-flop 402. The first flip-flop 401 includes a data terminal D receiving the first input clock signal CK(i−1)1', a clock terminal CK receiving the source clock signal SCKi and an output terminal Q generating a first synchronized input clock signal CKi1. The second flip-flop 402 includes a data terminal D receiving the second input clock signal CK(i−1)2', a clock terminal CK receiving an inversion signal of the source clock signal SCKi and an output terminal Q generating a second synchronized input clock signal SCKi2.

In the exemplary embodiment of FIG. 5, dashed portions of the input clock signals CK(i−1)1' and CK(i−1)2', which are received by the retimer RETi represent the mismatches due to propagation delays. The number of counter banks, the operational frequency, and other operational features may be adjusted so that the sampling timings of the flip-flops 401 and 402, that is, the edges of the source clock signal SCKi may not be aligned to the mismatches. The first and second flip-flops 401 and 402 may synchronize the mismatched input clock signals CK(i−1)1' and CK(i−1)2' to provide synchronized input clock signals CKi1 and CKi2 that are synchronized with the rising edges and falling edges of the source clock signal SCKi, respectively. Using the phase difference of the input clock signals CKi1 and CKi2, each counter may perform a quadruple data rate (QDR) counting: counting four times per cyclic period of the input clock signals CKi1 and CKi2.

FIG. 6 is a block diagram illustrating a counter of a phase-division scheme according to an exemplary embodiment in accordance with principles of inventive concepts. Counter 100a includes a buffer unit 10a and a ripple counter 30a. The buffer unit 10a may include a first counting unit 110a and a second counting unit 120a, and the ripple counter 30a may include a third counting unit 130a and a fourth counting unit 140a. In this exemplary embodiment, the gray bit signals in FIG. 2 may correspond to a first gray bit signal D0 and a second gray bit signal D1, the less significant bit signals in FIG. 2 may correspond to a first bit signal D[0] and a second bit signal D[1], and the more significant bit signals in FIG. 2 may correspond to a third bit signal D[2] and a fourth bit signal D[3], for example. In operation, first counting unit 110a generates the first gray bit signal D0 by latching a first input clock signal CK1 at the end of a signal accumulation period, and the second counting unit 120a generates the second gray bit signal D1 by latching a second input clock signal CK2 at the end of a signal accumulation period. The first input clock signal CK1 and the second input clock signal CK2 have respective phases different from each other. In response to the latch output signal LOUT corresponding to the second gray bit signal D1, the ripple counter 30a generates, the more significant bit signals, that is, the third bit signal D[2] and the fourth bit signal D[3] that are sequentially toggling. The latch output signal LOUT may be the second gray bit signal D1 or an inversion signal of the second gray bit signal D1 according to the configuration of the counter 100a.

In exemplary embodiments in accordance with principles of inventive concepts, the first counting unit 110a may latch the first input clock signal CK1 in response to the input signal INP indicating the termination time point Te of the counting operation (the end of a signal accumulation period, for example) to generate the first gray bit signal D0 having a logic level corresponding to a logic level of the first input clock signal CK1 at the termination time point Te. The second counting unit 120a may latch the second input clock signal CK2 in response to the input signal INP indicating the termination time point Te to generate the second gray bit signal D1 having a logic level corresponding to a logic level of the second input clock signal CK2 at the termination time point Te. The first gray bit signal D0 and the second gray bit signal D1 toggle during the counting operation and are latched signals of the first and second input clock signals CK1 and CK2 at the termination time point Te to provide the two less significant bits D[0] and D[1] of the binary code D[0:3], that is, the digital count value corresponding to the count result.

The ripple counter 30a in the counter 110a may include an arbitrary number of counting units, depending on the bit number of the digital value corresponding to the count result. Even though two counting units 130a and 140a are illustrated in FIG. 6 for convenience of description, the number of the counting units included in the ripple counter 30a may be changed according to the bit number of the binary code D[0:n]. Hereinafter, configurations and operations of the counter 100a are described referring to an exemplary embodiment in which the counter 100a generates four bit signals D[0], D[1], D[2] and D[3], that is, a four-bit binary code D[0:3].

In exemplary embodiments in accordance with principles of inventive concepts, ripple counter 30a has a cascade configuration such that the plurality of counting units 130a and 140*a* are sequentially coupled to toggle in response to an output signal of the previous counting unit. In other words, for example, the third counting unit 130*a* may toggle in response to the latch output signal LOUT from the second counting unit 120*a* and the fourth counting unit 140*a* may toggle in response to the output signal OUT3 from the third counting unit 130*a*. As a result, the more significant bit signals, that is, the third bit signal D[2] and the fourth bit signal D[3] have respective cyclic periods that are sequentially doubled.

The counter 100*a* may further include a logic unit, that is, for example, a code converter 50 that performs a logical operation on the first gray bit signal D0 and the second gray bit signal D1 to generate a first bit signal D[0], that is, the least significant bit signal of a binary code. For example, the code converter 50 may be an exclusive-OR (XOR) logic gate that performs an XOR logic operation on the first and second gray bit signals D0 and D1 to provide the first bit signal D[0]. The second gray bit signal D1 itself may correspond to the second bit signal D[1]. The first gray bit signal D0 and the second gray bit signal D1 may provide two less significant bits of the count value, which do not represent a straight binary code D[0:1], rather the first gray bit signal D0 and the second gray bit signal D1 represent a gray code. The less significant bit signals D[0] and D[1] may be obtained, when required, by processing the gray code bits D0 and D1. In accordance with principles of inventive concepts, less significant bit signals D[0] and D[1] do not toggle during the counting operation, and may be provided by performing a logic operation on the latched first and second gray bit signals D0 and D1 after the counting operation is terminated. Accordingly the code converter 50 may be separate from the counter 100*a*, and, in particular, in exemplary embodiments in accordance with principles of inventive concepts, may be located in a separate chip from that which includes counter 100*a*.

Figure 7:
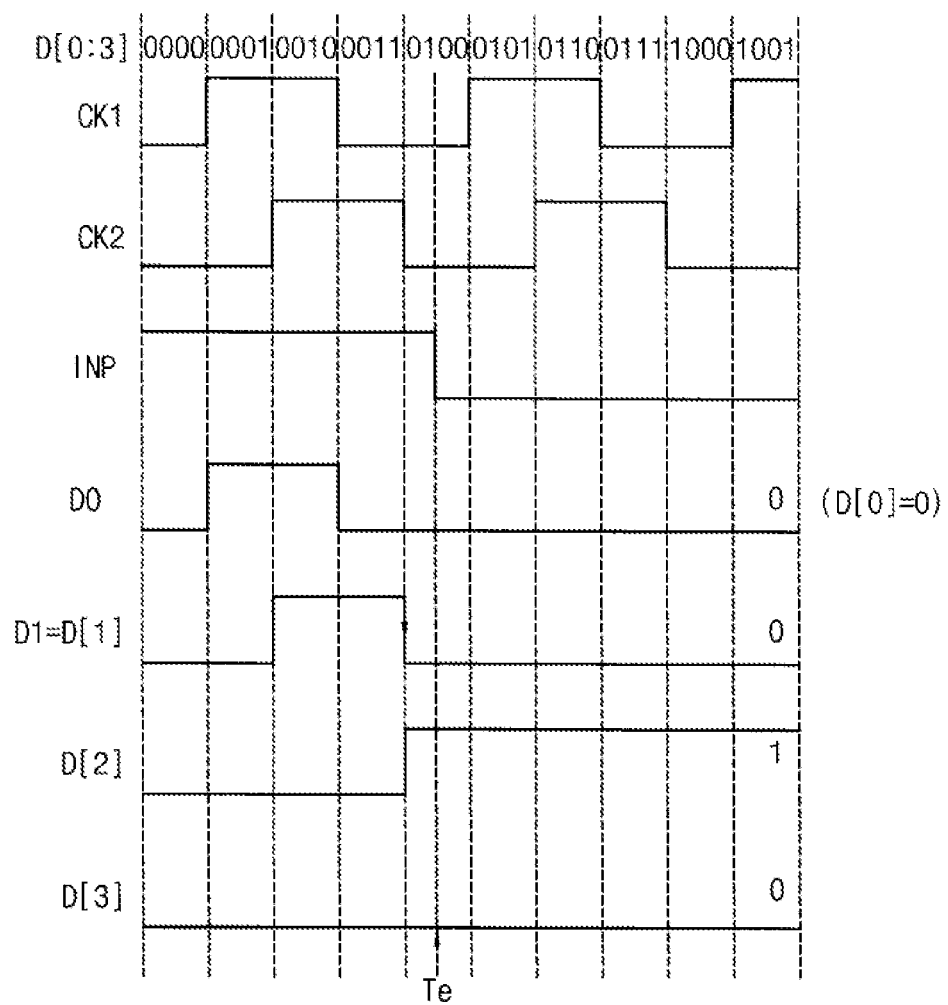
FIGS. 7 through 10 are timing diagrams illustrating a latching operation of the counter of FIG. 6.
Figure 8:
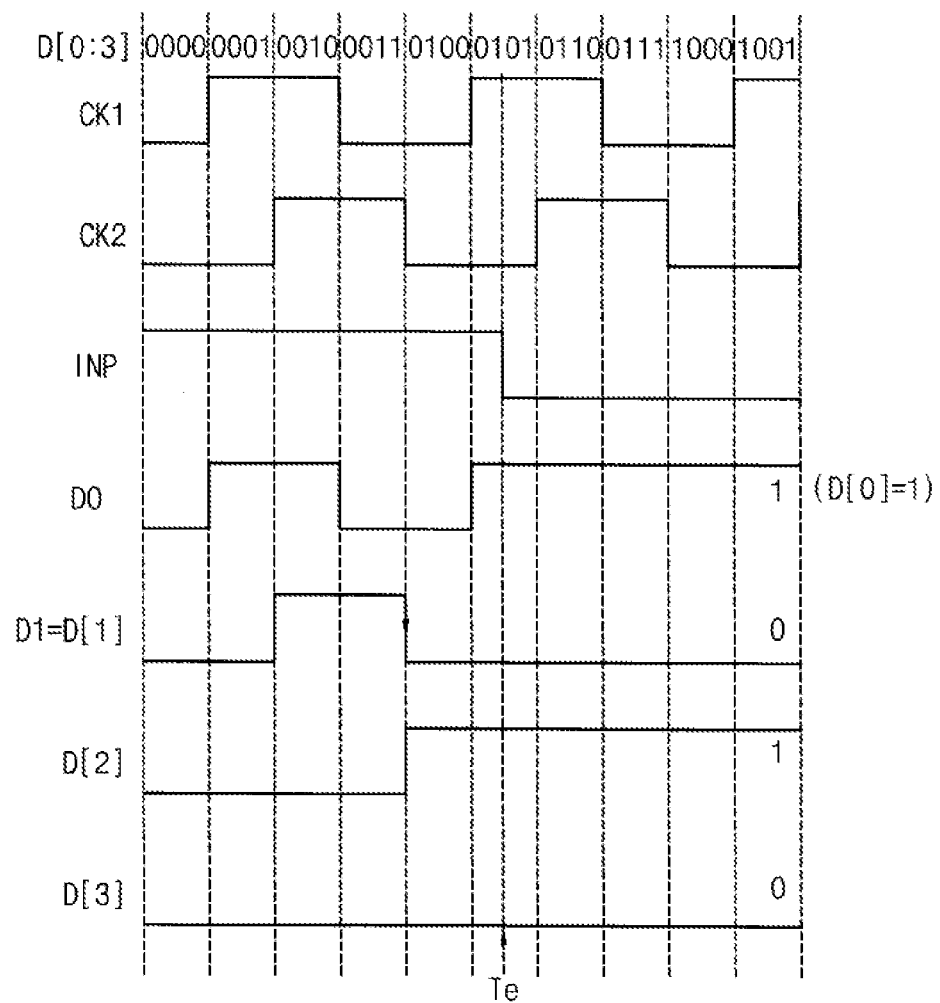
Figure 9:
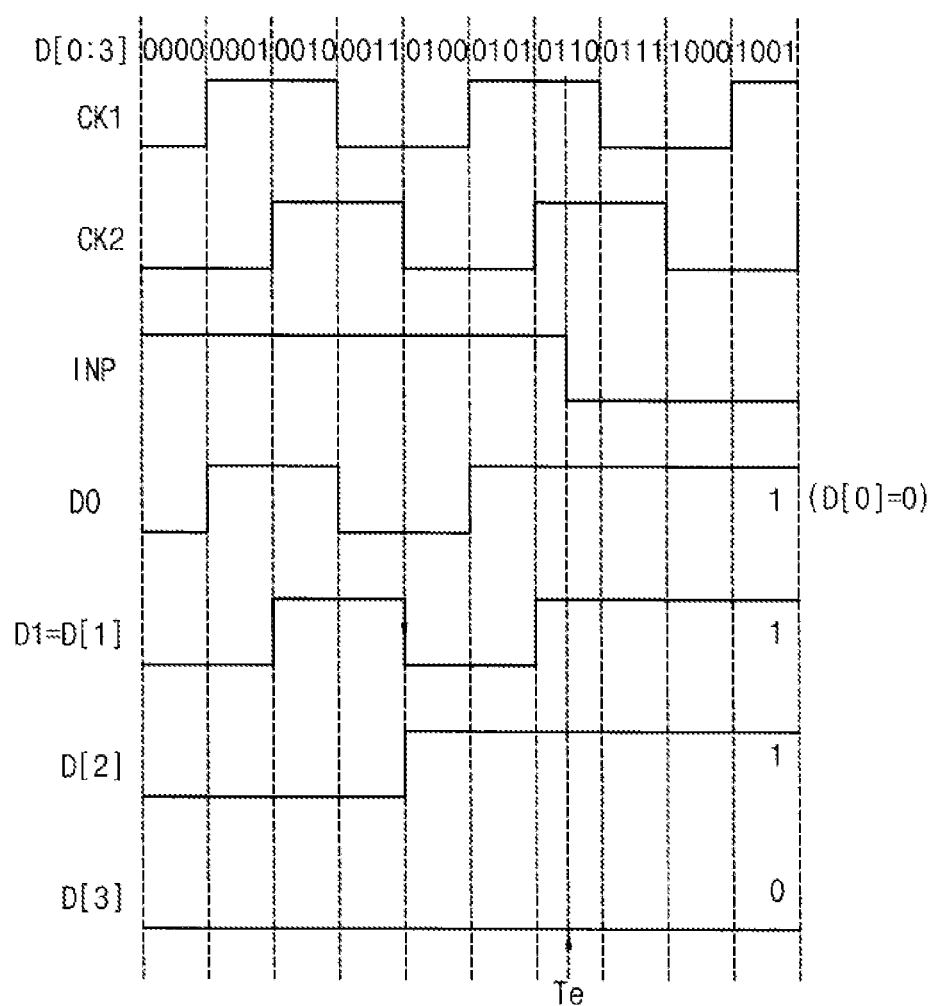
Figure 10:
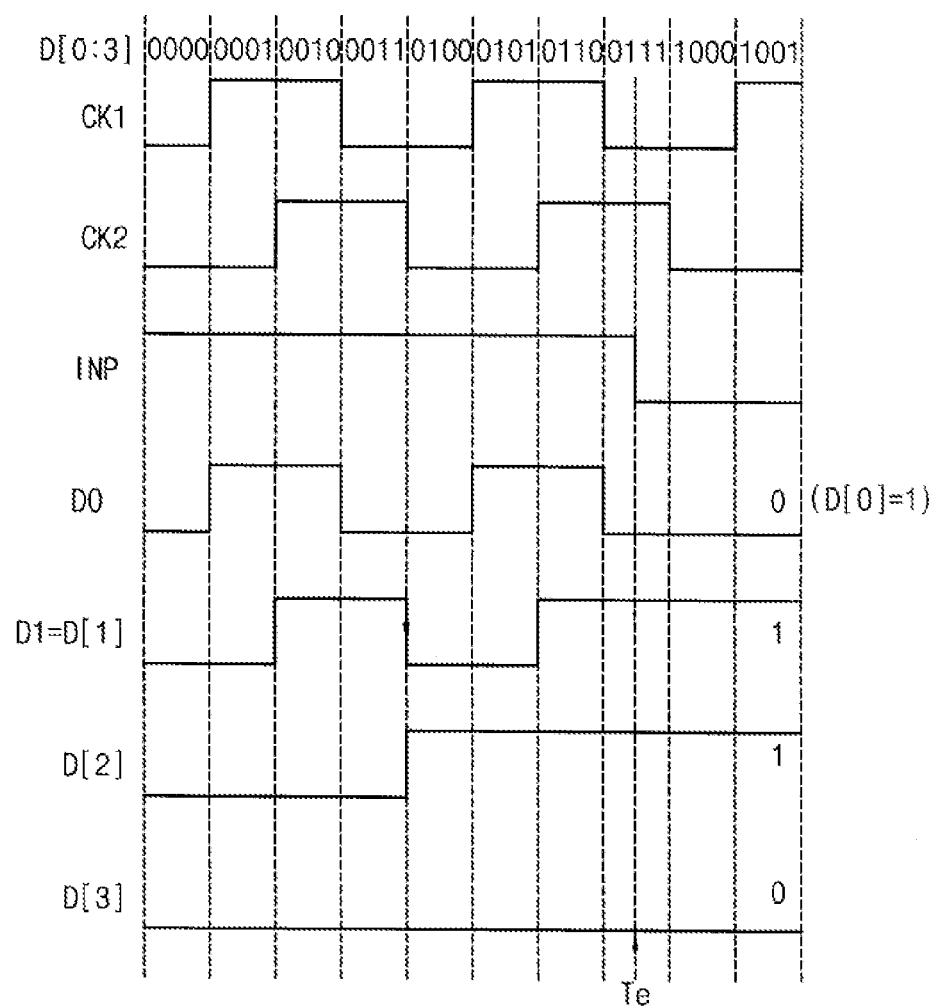

FIGS. 7 through 10 are timing diagrams illustrating a latching operation of the counter of FIG. 6. An edge (for example, a falling edge) of the input signal INP may indicate the termination time point Te of the counting operation. The first counting unit 110*a* may latch the logic level of the first input clock signal CK1 in response to the edge of the input signal INP to generate the first gray bit signal D0, and the second counting unit 120*a* may latch the logic level of the second input clock signal CK2 in response to the edge of the input signal INP to generate the second gray bit signal D1, that is, the second bit signal D[1]. FIG. 7 illustrates a case where the two bit gray code (D1D0) corresponds to 00 (i.e. the binary code D[0:1]=00), FIG. 8 illustrates a case where the two bit gray code (D1D0) corresponds to 01 (i.e. the binary code D[0:1]=01), FIG. 9 illustrates a case where the two bit gray code (D1D0) corresponds to 11 (i.e. the binary code D[0:1]=10), and FIG. 10 illustrates a case where the two bit gray code (D1D0) corresponds to 10 (i.e. the binary code D[0:1]=11).

As illustrated in FIGS. 7 through 10, the first gray bit signal D0 toggles with the first input clock signal CK1 and the second gray bit signal D1 toggles with the second input clock signal CK2 until the counting operation is terminated. The third counting unit 130*a* in the counter 100*a* toggles in response to the output of the second counting unit 120*a* rather than a distinct input clock signal.

The counter 100*a* of FIG. 6 may perform an up-counting operation or a down-counting operation according to the configuration thereof. Hereinafter, counters performing an up-counting operation are described with reference to FIGS. 11, 12 and 13, and counters performing a down-counting operation are described with reference to FIGS. 17, 18 and 19.

Figure 11:
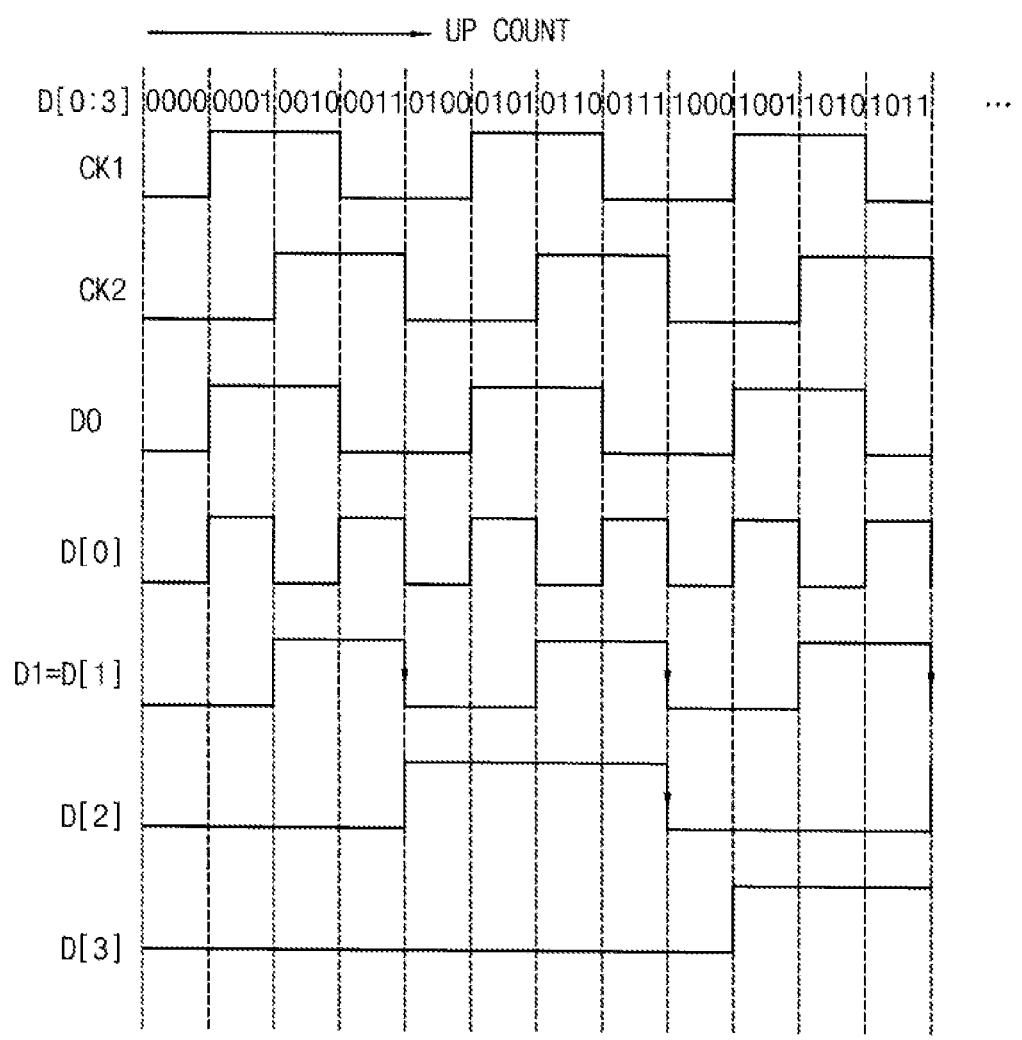
FIG. 11 is a timing diagram illustrating an up-counting operation of the counter of FIG. 6.

FIG. 11 is a timing diagram illustrating an up-counting operation of the counter of FIG. 6 in accordance with principles of inventive concepts. First counting unit 110*a* and second counting unit 120*a* operate as buffers during the counting operation, and, as a result, the first counting unit 110*a* generates the first gray bit signal D0 toggling with the first input clock signal CK1 and the second counting unit 120*a* generates the second gray bit signal D1 toggling with the second input clock signal CK2 until the termination time point Te. When performing the up-counting operation, the phase of the first input clock signal CK1 may precede the phase of the second input clock signal CK2 by 90 degrees as illustrated in the exemplary embodiment of FIG. 11. As previously described, the least significant bit D[0] does not toggle during the counting operation, and the least significant bit D[0] is generated by performing a logic operation on the latched first and second gray bit signals D0 and D1 after the counting operation is terminated. The more significant signals D[2] and D[3] toggle respectively in response to falling edges of the output of the previous counting unit. That is, in exemplary embodiments, the third bit signal D[2] toggles in response to the falling edges of the latch output signal LOUT corresponding to the second bit signal D[1], and the fourth bit signal D[3] toggles in response to the falling edges of the third bit signal D[2]. As a result, the more significant bit signals D[2] and D[3] have the respective cyclic periods that are sequentially doubled as illustrated in FIG. 11, and represent the two more significant bits of the binary code D[0:3]. As previously described, in accordance with principles of inventive concepts, the first gray bit signal D0 and the second gray bit signal D1 are generated by latching the first and second input clock signals CK1 and CK2 at the termination time point Te of the counting operation.

Referring to the values of the binary code D[0:3] in FIG. 11 corresponding to counting results at respective termination time points, the binary code D[0:3] increases as 0000, 0001, 0010, 0011, which indicates that the counter is counting up; the up-counting is performed.

As illustrated in FIG. 11, the counter 100*a* of the phase-division scheme according to exemplary embodiments has a quadruple operation speed compared with the conventional ripple counter because the counter 100*a* counts four times per the cyclic period of the input clock signals CK1 and CK2. Such counting may be referred to as Quadruple Data Rate (QDR) counting, and the counter 100*a* may be referred to as a QDR counter. Due to the quadruple operation speed, the counter 100*a* may provide a binary code having more bits, or resolution, than a conventional counter. In other words, the counter 100*a* may provide a more precise counting result, for example, in relation to the slope of a ramp signal in an image sensor. Even though, in exemplary embodiments, counter 100*a* uses a clock signal having a quarter frequency with respect to a conventional ripple counter, the counter 100*a* may provide a counting result of the same bits in the same counting duration. Accordingly, in exemplary embodiments in accordance with principles of inventive concepts, QDR counter 100*a* may reduce power consumption through reduction of the frequency of the clock signal, and operation margin may be enhanced in a QDR counter 100*a* and in devices employing a QDR counter 100*a* in accordance with principles of inventive concepts.

Figure 12:
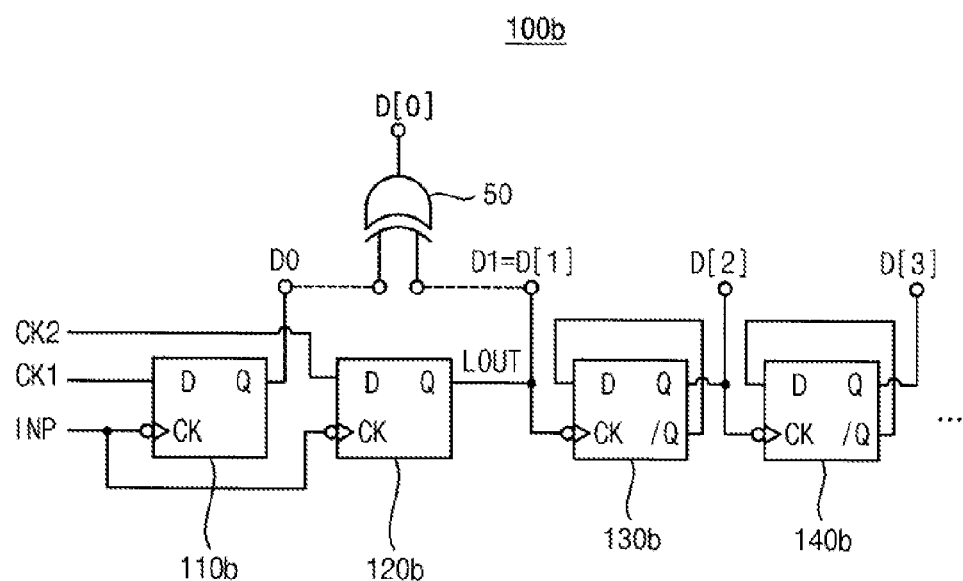
FIGS. 12 and 13 are circuit diagrams illustrating exemplary embodiments of a counter performing an up-counting operation.
Figure 13:
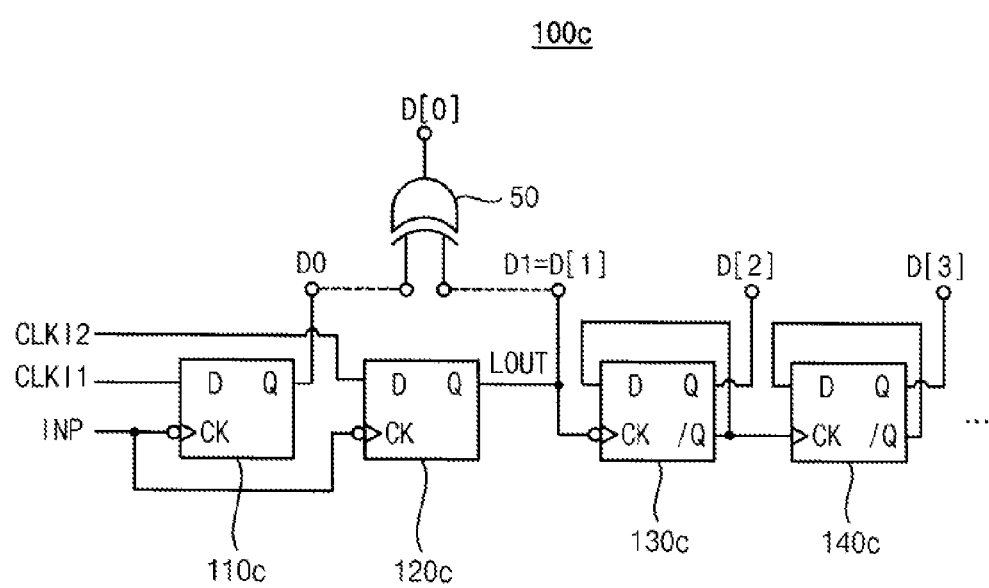

FIGS. 12 and 13 are circuit diagrams illustrating exemplary embodiments of a counter performing an up-counting operation in accordance with principles of inventive concepts. First counting unit 110a in FIG. 6 may be implemented with a first latch or a first clock buffer 110b, and the second counting unit 120a in FIG. 6 may be implemented with a second latch or a second clock buffer 120b. The first clock buffer 110b includes a data terminal D receiving a first input clock signal CK1, a clock terminal CK receiving an input signal INP indicating the termination time point Te of the counting operation, and an output terminal Q outputting a first gray bit signal D0. The second clock buffer 120b includes a data terminal D receiving a second input clock signal CK2, a clock terminal CK receiving the input signal INP indicating the termination time point Te, and an output terminal Q outputting a second gray bit signal D1. Additionally, as illustrated in FIG. 13, the first counting unit 110a in FIG. 6 may be implemented with a first latch or a first clock buffer 110c, and the second counting unit 120a in FIG. 6 may be implemented with a second latch or a second clock buffer 120c.

As illustrated in FIGS. 12 and 13, in accordance with principles of inventive concepts, the ripple counter 30a in FIG. 6 may be implemented with a plurality of flip-flops that are cascade-coupled to generate the more significant bit signals D[2] and D[3].

Referring to FIG. 12, the third counting unit 130b and the fourth counting unit 140b may be implemented with negative-edge triggered flip-flops for generating the sequentially-toggling more significant bit signals D[2] and D[3]. Referring to FIG. 13, third counting unit 130c may be implemented with a negative-edge triggered flip-flop and the fourth counting unit 140c may be implemented with a positive-edge triggered flip-flop for generating the sequentially-toggling more significant bit signals D[2] and D[3].

In the exemplary embodiment of FIG. 12, the third counting unit 130b and the fourth counting unit 140b are implemented with the negative-edge triggered flip-flops such that the non-inversion output terminal (Q) of the previous counting unit is coupled to the data terminal D of the next counting unit. In such an embodiment, the output signal OUTk provided to the next counting unit corresponds to the k-th bit signal D[k], where k is an integer greater than two. The third counting unit 130c of FIG. 13 is implemented with the negative-edge triggered flip-flop and the fourth counting unit 140c of FIG. 13 is implemented with the positive-edge triggered flip-flop such that the inversion output terminal (/Q) of the previous counting unit is coupled to the data terminal D of the next counting unit. In such an embodiment, the output signal OUTk provided to the next counting unit corresponds to the inversion signal /D[k] of the k-th bit signal D[k]. As a result, both of the counters 100b and 100c of FIGS. 12 and 13 may perform the up-counting operation as illustrated in FIG. 11.

As described in greater detail below, the latch or the clock buffer may be implemented in the same, or similar configuration as that of FIG. 14, and the positive-edge triggered flip-flops and the negative-edge triggered flip-flops may be implemented in the same or similar configurations as those of FIGS. 15 and 16.

Figure 14:
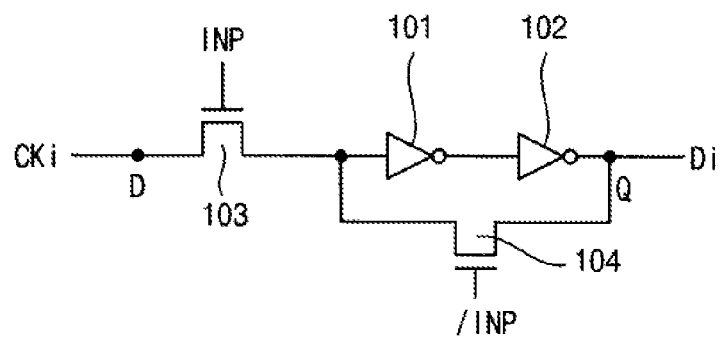
FIG. 14 is a circuit diagram illustrating an exemplary of a latch included in the latch unit.

FIG. 14 is a circuit diagram illustrating an exemplary embodiment of a latch such as may be included in a latch unit in accordance with principles of inventive concepts.

An exemplary embodiment of the latch or the clock buffer in the buffer unit 10a in FIG. 6 is illustrated in FIG. 14, and the leaches 110b, 110c, 120b and 120c in FIGS. 12 and 13 may be implemented with the clock buffer of FIG. 14. The exemplary configuration of the clock buffer is presented in FIG. 14 for describing the buffering and latching operations of the buffer unit 10a, and the configuration of the clock buffer may be modified while remaining within the scope of inventive concepts.

Referring to FIG. 14, the clock buffer may include a first inverter 101, a second inverter 102, a first switch 103 and a second switch 104. The output of the first inverter 101 is coupled to the input of the second inverter 102, and the output of the second inverter 102 is coupled to the input of the first inverter 101 via the second switch 104, thereby forming a latch configuration. In the exemplary embodiment of FIG. 14, the output of the second inverter 102 corresponds to a non-inversion output terminal Q. The first switch 103 is coupled between a data terminal D and the input of the first inverter 101. The input clock signal CKi is applied to a data terminal D, the input signal INP indicating the termination time point is applied to the control terminal of the first switch 103, and an inverted input signal /INP is applied to the control terminal of the second switch 104.

As described above, the edge (for example, a falling edge) of the input signal INP may indicate the termination time point Te. In such embodiments, the first switch 103 is turned on and the second switch 104 is turned off until the termination time point Te, and the clock buffer performs a buffering operation. When the input signal INP transitions from logic high to logic low at the termination time point Te, the first switch 103 is turned off and the second switch 104 is turned on, thereby latching the logic level of the input clock signal CLKI at the termination time point Te. As a result, the gray bit signal Di output at the non-inversion output terminal Q may toggle with the input clock signal CLKI until the termination time point Te and then maintain the latched logic level after the termination time point Te.

Figure 15:
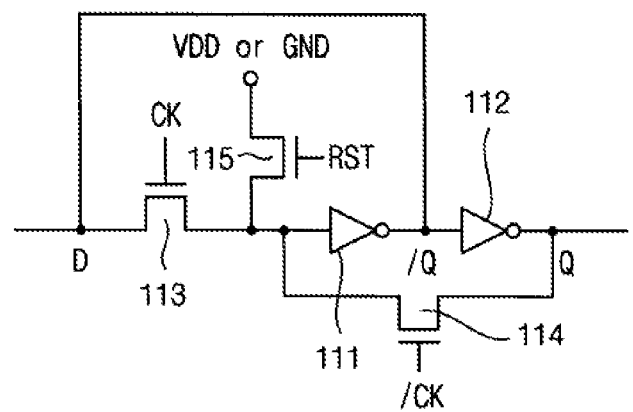
FIGS. 15 and 16 are circuit diagrams illustrating examples of a flip-flop performing a toggling operation.
Figure 16:
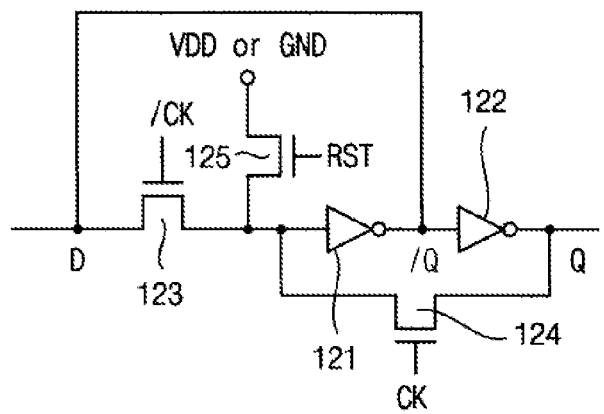

FIGS. 15 and 16 are circuit diagrams illustrating exemplary embodiments of a flip-flop performing a toggling operation.

FIG. 15 illustrates an exemplary embodiment of a positive-edge triggered flip-flop and FIG. 16 illustrates an exemplary embodiment of a negative-edge triggered flip-flop. The exemplary embodiments of the flip-flops in FIGS. 15 and 16 are presented for describing the toggling operation of the ripple counter 30 in FIG. 2, and the configuration of the flip-flops may be changed while remaining with the scope of inventive concepts.

Referring to FIG. 15, the positive-edge triggered flip-flop may include a first inverter 111, a second inverter 112, a first switch 113 and a second switch 114.

In exemplary embodiments the output of the first inverter 111 is coupled to the input of the second inverter 112, and the output of the second inverter 112 is coupled to the input of the first inverter 111 via the second switch 114, thereby forming a latch. In the exemplary embodiment of FIG. 15, the output of the first inverter 111 corresponds to an inversion output terminal /Q and the output of the second inverter 112 corresponds to a non-inversion output terminal Q. The first switch 113 is coupled between a data terminal D and the input of the first inverter 111 and the control terminal CK of the first switch 113 corresponds to a clock terminal. A clock signal CLK is applied to the control terminal CK of the first switch 113 and an inversion signal /CLK of the clock signal CLK is applied to the control terminal /CK of the second switch 114.

The positive-edge triggered flip-flop of FIG. 15 may include a reset switch 115 for initializing the state of the flip-flop. In exemplary embodiments, when the reset switch 115 is turned on in response to a reset signal RST, the inversion output terminal /Q and the output terminal Q may be initialized respectively to logic low or logic high depending on the reset voltage.

When the clock signal CLK applied to the control terminal CK is logic low, the flip-flop of FIG. 15 is in a storage state that does not change even though the logic level of the data terminal D is changed. When the clock signal CLK transitions from logic low to logic high, that is, at the rising edge of the clock signal CLK, the logic level of the data terminal D is transferred into the non-inversion output terminal Q. A flip-flop for which the logic state is determined in synchronization with the edge of the signal applied to the clock terminal CK may be referred to as an edge triggered flip-flop, and the flip-flop of the exemplary embodiment of FIG. 15 is a positive-edge triggered flip-flop.

The positive-edge triggered flip-flop may toggle when the inversion output terminal /Q is coupled to the data terminal D. When the clock signal CLK applied to the control terminal CK transitions to logic low, the second switch 114 is turned on and the data terminal D is set to logic level opposite to the non-inversion output terminal Q, but the state of the flip-flop is not changed since the first switch 113 is turned off. When the clock signal CLK transitions to logic high, the first switch 113 is turned on and logic level of the inversion output terminal is applied to the input of the first inverter 111, thereby inverting the logic state of the non-inverting output terminal Q. As such, the positive-edge triggered flip-flop toggles by inverting the storage state from logic high to logic low or from logic low to logic high at the rising edge of the clock signal CLK applied to the control terminal CK.

Referring to FIG. 16, the negative-edge triggered flip-flop has a configuration similar to the positive-edge triggered flip-flop of FIG. 15, but the inversion signal /CLK of the clock signal CLK is applied to the control gate /CK of the first switch 123 and the clock signal CLK is applied to the control gate CK of the second switch 124. That is, the flip-flops of FIGS. 15 and 16 are different in that the control terminals CK and /CK are exchanged.

The negative-edge triggered flip-flop of FIG. 16 toggles in response to the falling edges of the clock signal CLK, whereas the positive-edge triggered flip-flop of FIG. 15 toggles in response to the rising edges of the clock signal CLK. When the clock signal CLK applied to the control terminal CK transitions to logic high, the second switch 124 is turned on and the data terminal D is set to logic level opposite to the non-inversion output terminal Q but the state of the flip-flop is not changed since the first switch 123 is turned off. When the clock signal CLK transitions to logic low, the first switch 123 is turned on and logic level of the inversion output terminal is applied to the input of the first inverter 111, thereby inverting the logic state of the non-inverting output terminal Q. As such, the negative-edge triggered flip-flop toggles by inverting the storage state from logic high to logic low or from logic low to logic high at each falling edge of the clock signal CLK applied to the control terminal CK.

The counter 100 may include positive-edge triggered flip-flops and/or negative-edge triggered flip-flops for performing the up-counting operation as above described and the down-counting operation as will be described, for example.

Figure 17:
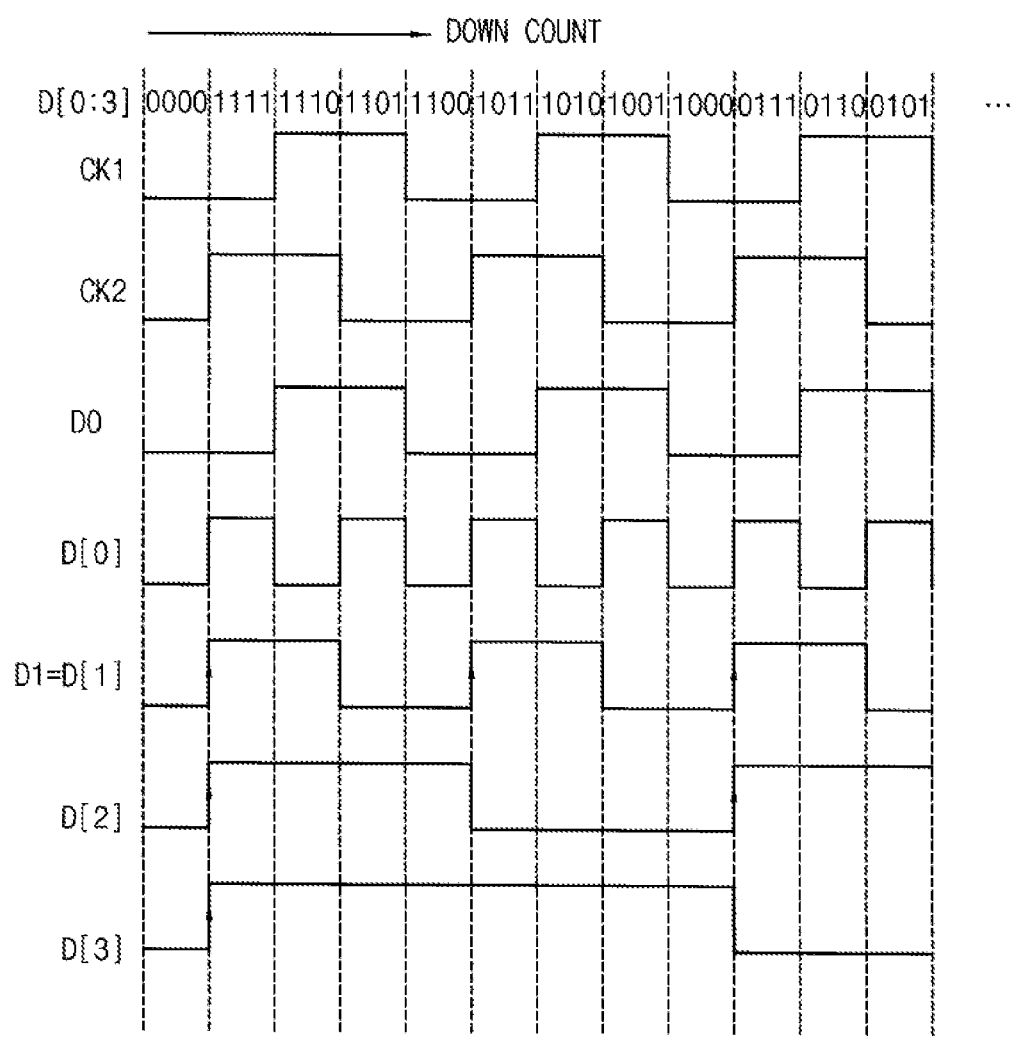
FIG. 17 is a timing diagram illustrating a down-counting operation of the counter of FIG. 6.

FIG. 17 is a timing diagram illustrating a down-counting operation of the counter of FIG. 6.

Referring to FIGS. 6 and 17, the first counting unit 110a and the second counting unit 120a may operate as buffers during the counting operation, and thus generate the first gray bit signal D0 toggling with the first input clock signal CK1 and the second gray bit signal D1 toggling with the second input clock signal CK2 until the termination time point Te. When performing the down-counting operation, or, simply counting down, the phase of the first input clock signal CK1 may lag behind the phase of the second input clock signal CK2 by 90 degrees as illustrated in FIG. 17, whereas the phase of the first input clock signal CK1 precedes the phase of the second input clock signal CK2 by 90 degrees as illustrated in FIG. 11 when counting up. As previously described, the least significant bit D[0] is not a signal toggling during the counting operation, and is generated by performing a logic operation on the latched first and second gray bit signals D0 and D1, after the counting operation is terminated. The more significant signals D[2] and D[3] toggle respectively in response to rising edges of the output of the previous counting unit. That is, in exemplary embodiments in accordance with principles of inventive concepts, the third bit signal D[2] toggles in response to the rising edges of the latch output signal LOUT corresponding to the second gray bit signal D1, and the fourth bit signal D[3] toggles in response to the rising edges of the third bit signal D[2]. As a result, the more significant bit signals D[2] and D[3] have respective cyclic periods that are sequentially doubled as illustrated in FIG. 17, and represent the two more significant bits of the binary code D[0:3]. As previously described, the first gray bit signal D0 and the second gray bit signal D1 are provided by latching the first and second input clock signals CK1 and CK2 at the termination time point Te of the counting operation.

Referring to the values of the binary code D[0:3] in FIG. 17 corresponding to counting results at respective termination time points, the binary code D[0:3] decreases as 0000, 1111, 1110, 1101, which indicates that down-counting is performed.

As illustrated in FIGS. 11 and 17, the counter 100a in FIG. 6 according to exemplary embodiments may be implemented to perform up-counting or down-counting, and in both cases, the counter 100a has a quadruple operation speed compared with a conventional ripple counter, because in accordance with principles of inventive concepts, the counter 100a counts four times for each cyclic period of the input clock signal CK1 and CK2.

Figure 18:
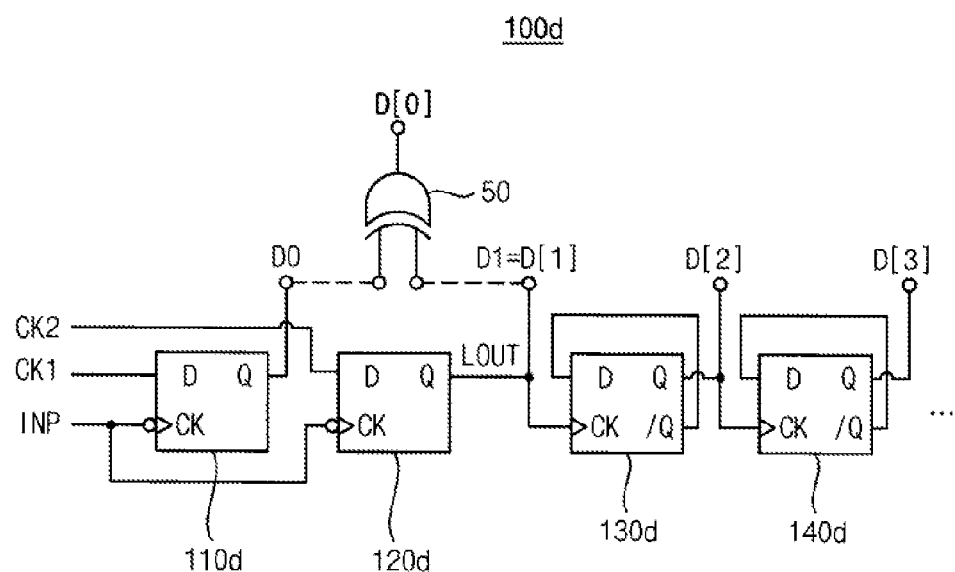
FIGS. 18 and 19 are circuit diagrams illustrating exemplary embodiments of a counter performing a down-counting operation.
Figure 19:
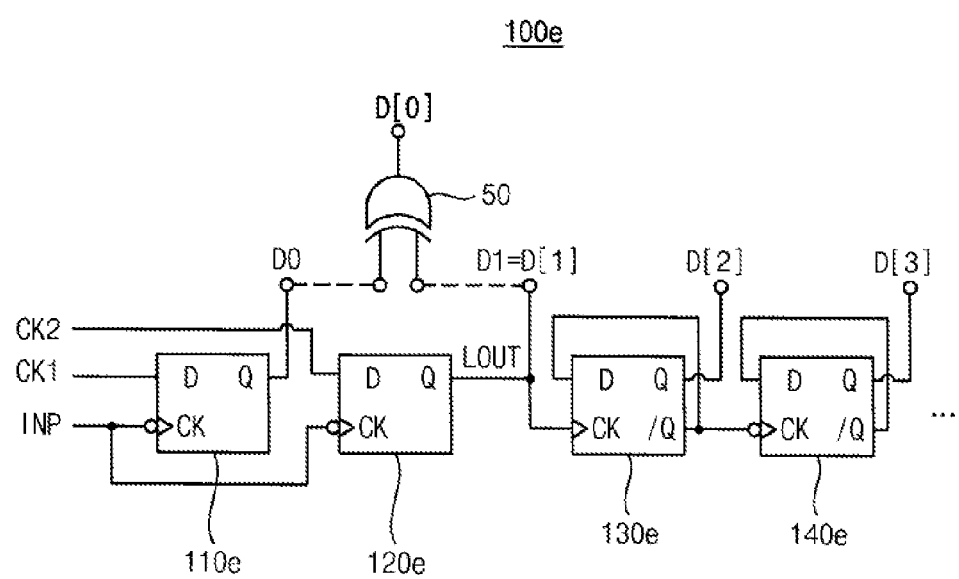

FIGS. 18 and 19 are circuit diagrams illustrating exemplary embodiments of a counter counting down in accordance with principles of inventive concepts.

As illustrated in FIG. 18, the first counting unit 110a in FIG. 6 may be implemented with a first latch or a first clock buffer 110d and the second counting unit 120a in FIG. 6 may be implemented with a second latch or a second clock buffer 120d. Similarly, as illustrated in FIG. 19, the first counting unit 110a in FIG. 6 may be implemented with a first latch or a first clock buffer 110e and the second counting unit 120a in FIG. 6 may be implemented with a second latch or a second clock buffer 120e. The ripple counter 30a in FIG. 6 may be implemented with a plurality of flip-flops that are cascade-coupled to generate the more significant bit signals D[2] and D[3].

Referring to FIG. 18, the third counting unit 130d and the fourth counting unit 140d may be implemented with positive-edge triggered flip-flops for generating the sequentially-toggling more significant bit signals D[2] and D[3]. Referring to FIG. 19, the third counting unit 130e may be implemented with a positive-edge triggered flip-flop and the fourth counting unit 140e may be implemented with a negative-edge triggered flip-flop for generating the sequentially-toggling more significant bit signals D[2] and D[3].

In FIG. 18, the third counting unit 130e and the fourth counting unit 140e are implemented with the positive-edge triggered flip-flops such that the non-inversion output terminal (Q) of the previous counting unit is coupled to the data terminal D of the next counting unit. In this exemplary embodiment, the output signal OUTk provided to the next counting unit corresponds to the k-th bit signal D[k], where k is an integer greater than two. In contrast, in FIG. 19, the third counting unit 130e is implemented with the positive-edge triggered flip-flop and the fourth counting unit 140e is implemented with the negative-edge triggered flip-flop such that the inversion output terminal (/Q) of the previous counting unit is coupled to the data terminal D of the next counting unit. In this exemplary embodiment, the output signal OUTk provided to the next counting unit corresponds to the inversion signal /D[k] of the k-th bit signal D[k]. As a result, both of the counters 100d and 100e of FIGS. 18 and 19 may count down as illustrated in FIG. 17.

Figure 20:
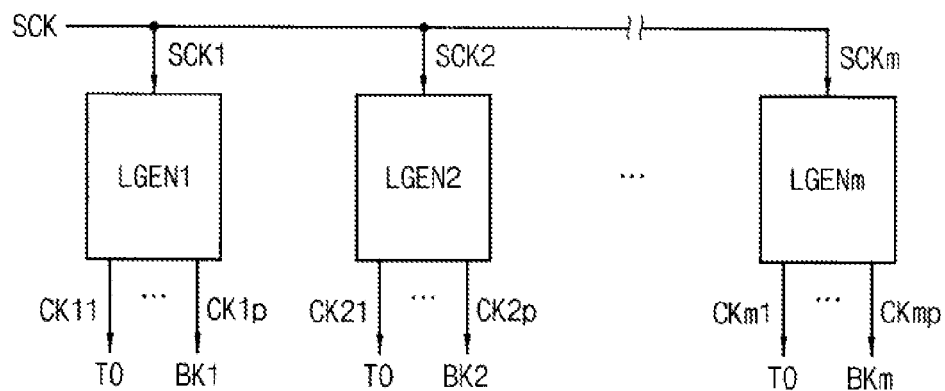
FIG. 20 is a block diagram illustrating an exemplary embodiment of a clock supply circuit included in the analog-to-digital converter of FIG. 1.

FIG. 20 is a block diagram illustrating an exemplary embodiment of a clock supply circuit included in the analog-to-digital converter of FIG. 1. Clock supply circuit 400b may include a plurality of local clock generators LGEN1 through LGENm. Each local clock generator LGENi (i=1, 2, ..., m) generates the input clock signals CKi1 through CKip in response to the source clock signal SCKi. The local clock generators LGEN1 through LGENm correspond to the synchronization circuits SYN1 through SYNm in FIG. 1. The input clock signals CKi1 through CKip generated by each local clock generator LGENi are provided to each counter bank BKi.

Figure 21:
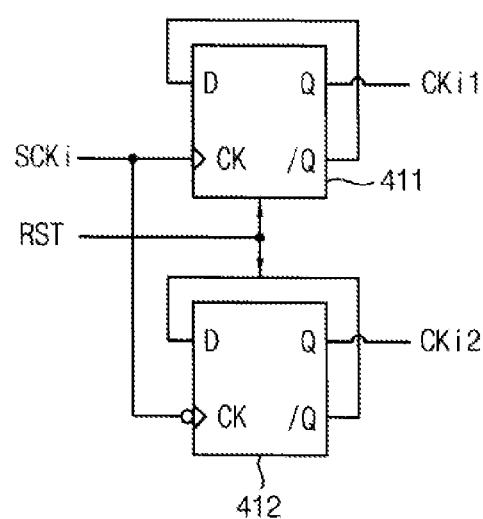
FIG. 21 is a diagram illustrating an exemplary embodiment of a local clock generator included in the clock supply circuit of FIG. 20.
Figure 22:
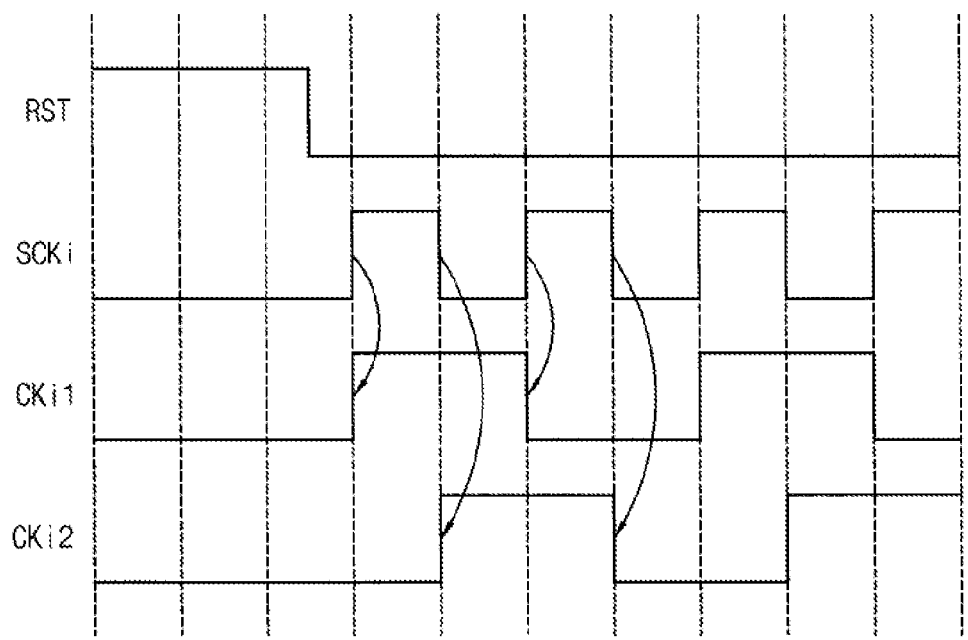
FIG. 22 is a timing diagram illustrating an exemplary operation of the local clock generator of FIG. 21.

FIG. 21 is a diagram illustrating an exemplary embodiment of a local clock generator such as included in the clock supply circuit of FIG. 20, and FIG. 22 is a timing diagram illustrating an exemplary operation of a local clock generator such as that of FIG. 21.

FIGS. 21 and 22 illustrate an exemplary embodiment in which the number of the input clock signals is two. The input clock signals may include a first input clock signal CKi1 and a second input clock signal CKi2 having the same frequency, and a phase of the second input clock signal CKi2 may lag behind a phase of the first input clock signal CKi1 by 90 degrees, for example.

As illustrated in FIG. 21, in exemplary embodiments in accordance with principles of inventive concepts, each local clock generator LGENa, that is, each synchronization circuit, may include a first toggling flip-flop 411 and a second toggling flip-flop 412. The toggling flip-flops may be implemented as described with reference to FIGS. 15 and 16, for example. Referring to FIG. 22, the first toggling flip-flop 411 generates the first input clock signal CKi1 in synchronization with rising edges of the source clock signal SCKi, and the second toggling flip-flop 412 generates the second input clock signal CKi2 in synchronization with falling edges of the source clock signal SCKi. The first and second toggling flip-flops 411 and 412 may be initialized in response to a reset signal RST. Using the phase difference of the input clock signals CKi1 and CKi2, each counter may perform a quadruple data rate (QDR) counting operation characterized by counting four times per cyclic period of the input clock signals CKi1 and CKi2.

Figure 23:
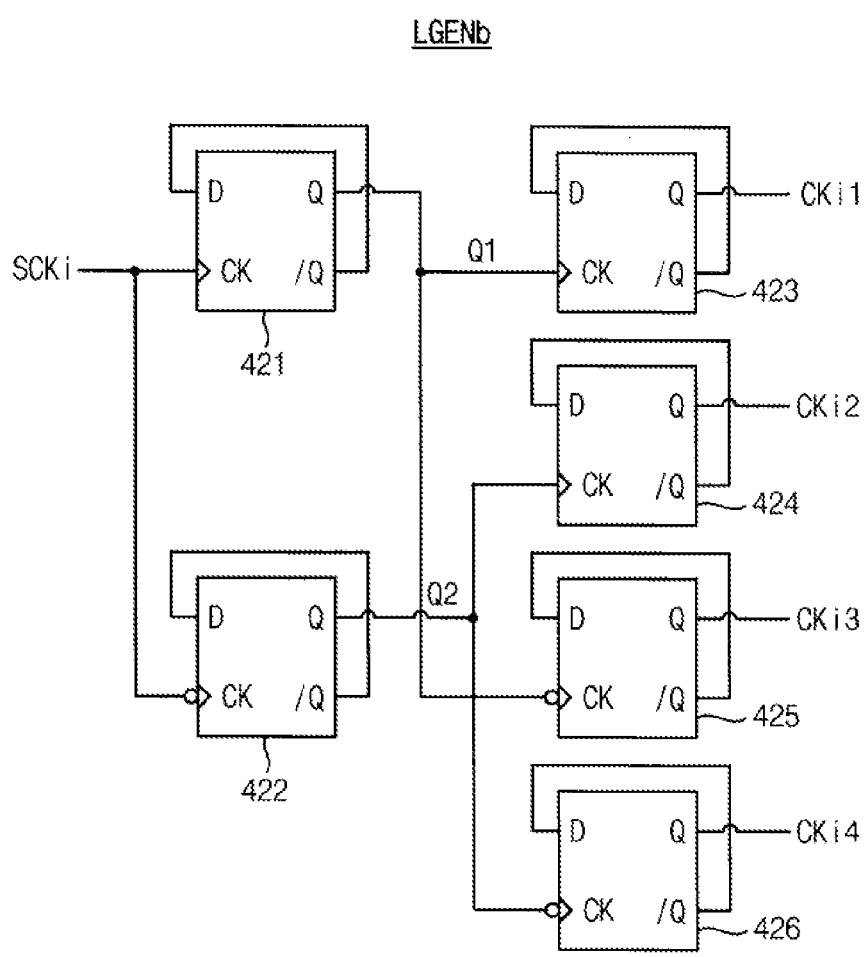
FIG. 23 is a diagram illustrating another exemplary embodiment of a local clock generator included in the clock supply circuit of FIG. 20.
Figure 24:
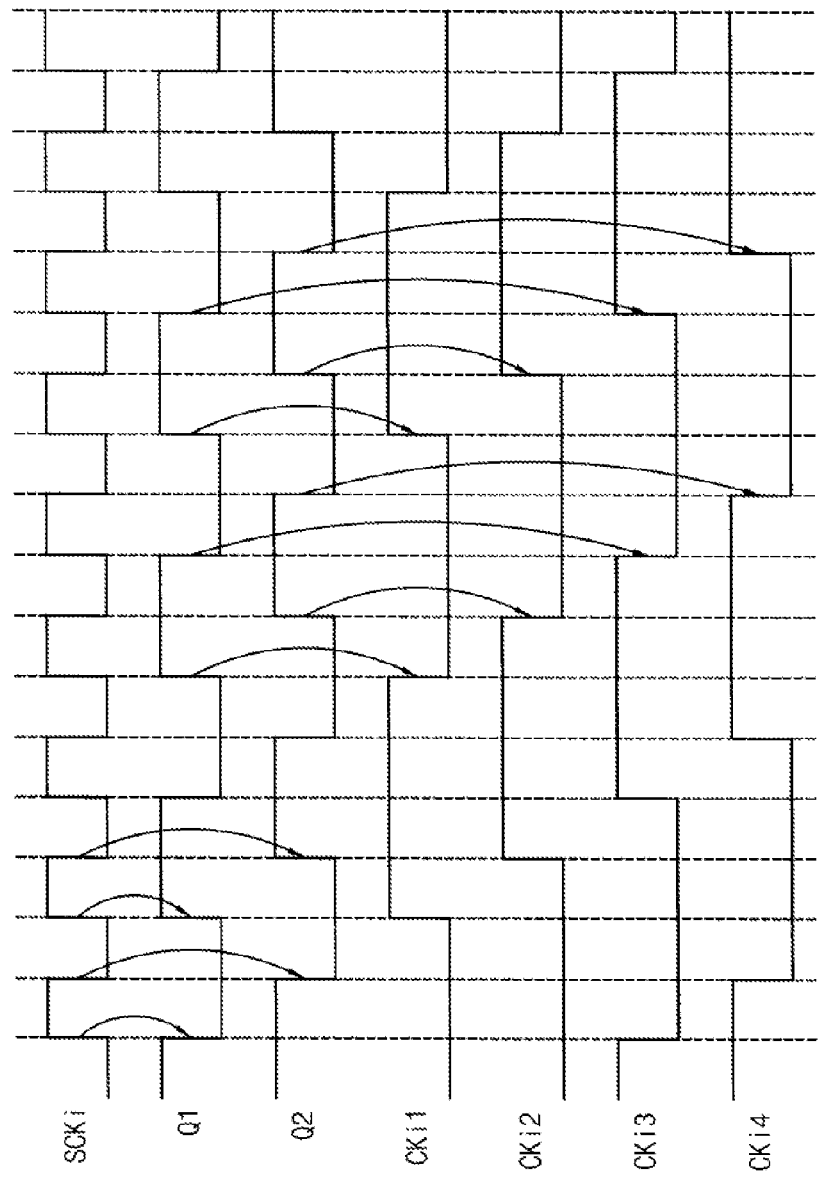
FIG. 24 is a timing diagram illustrating an exemplary operation of the local clock generator of FIG. 23.

FIG. 23 is a diagram illustrating another exemplary embodiment of a local clock generator such as may be included in the clock supply circuit of FIG. 20, and FIG. 24 is a timing diagram illustrating an exemplary operation of the local clock generator of FIG. 23.

FIGS. 23 and 24 illustrate an exemplary embodiment in which the number of input clock signals is four. The input clock signals may include a first input clock signal CKi1, a second input clock signal CKi2, a third input clock signal CKi3 and a fourth input clock signal CKi4 having the same frequency. In this exemplary embodiment the phase of the second input clock signal CKi2 may lag behind a phase of the first input clock signal CKi1 by 45 degrees, the phase of the third input clock signal CKi3 may lag behind the phase of the second input clock signal CKi2 by 45 degrees, and the phase of the fourth input clock signal CKi4 may lag behind the phase of the third input clock signal CKi3 by 45 degrees, for example.

As illustrated in FIG. 23, in exemplary embodiments each local clock generator LGENa, that is, each synchronization circuit, may include a first toggling flip-flop 421, a second toggling flip-flop 422, a third toggling flip-flop 423, a fourth toggling flip-flop 424, a fifth toggling flip-flop 425 and a sixth toggling flip-flop 426. The toggling flip-flops may be configured as described with reference to FIGS. 15 and 16. Referring to FIG. 24, the first toggling flip-flop 421 generates a first toggling signal Q1 in synchronization with rising edges of the source clock signal SCKi, and the second toggling flip-flop 422 generates a second toggling signal Q2 in synchronization with falling edges of the source clock signal SCKi. The third toggling flip-flop 423 generates the first input clock signal CKi1 in synchronization with rising edges of the first toggling signal Q1 and the fourth toggling flip-flop 424 generates the second input clock signal CKi2 in synchronization with rising edges of the second toggling signal Q2. The fifth toggling flip-flop 425 generates the third input clock signal CKi3 in synchronization with falling edges of the first toggling signal Q3 and the sixth toggling flip-flop 426 generates the fourth input clock signal CKi4 in synchronization with falling edges of the second toggling signal Q2. In accordance with principles of inventive concepts, using the phase differences of the input clock signals CKi1, CKi2, CKi3 and CKi4, each counter may perform a octuplet data rate (ODR) counting operation of counting eight times per cyclic period of the input clock signals CKi1, CKi2, CKi3 and CKi4.

Figure 25:
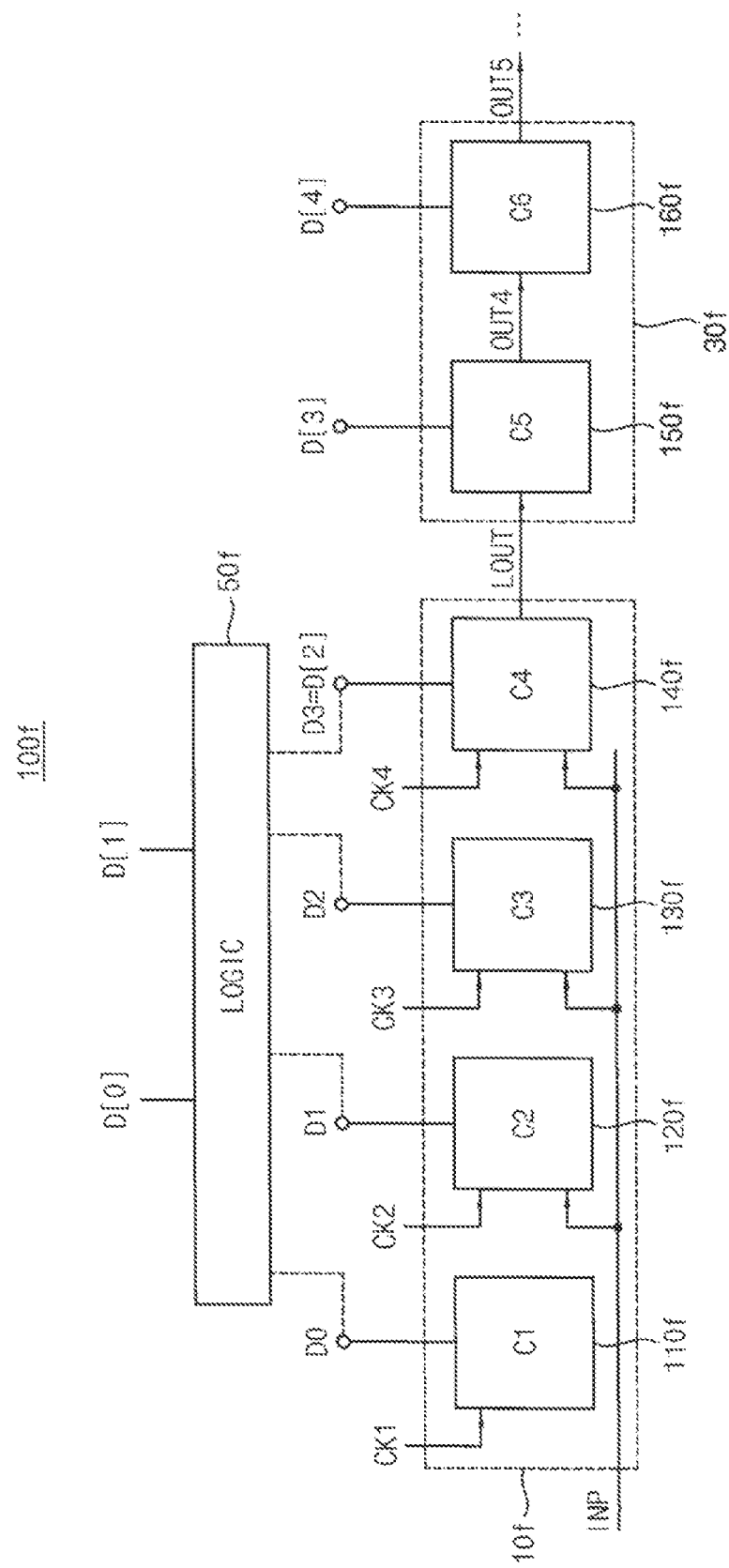
FIG. 25 is a block diagram illustrating a counter of a phase-division scheme according to an exemplary embodiment.
Figure 26:
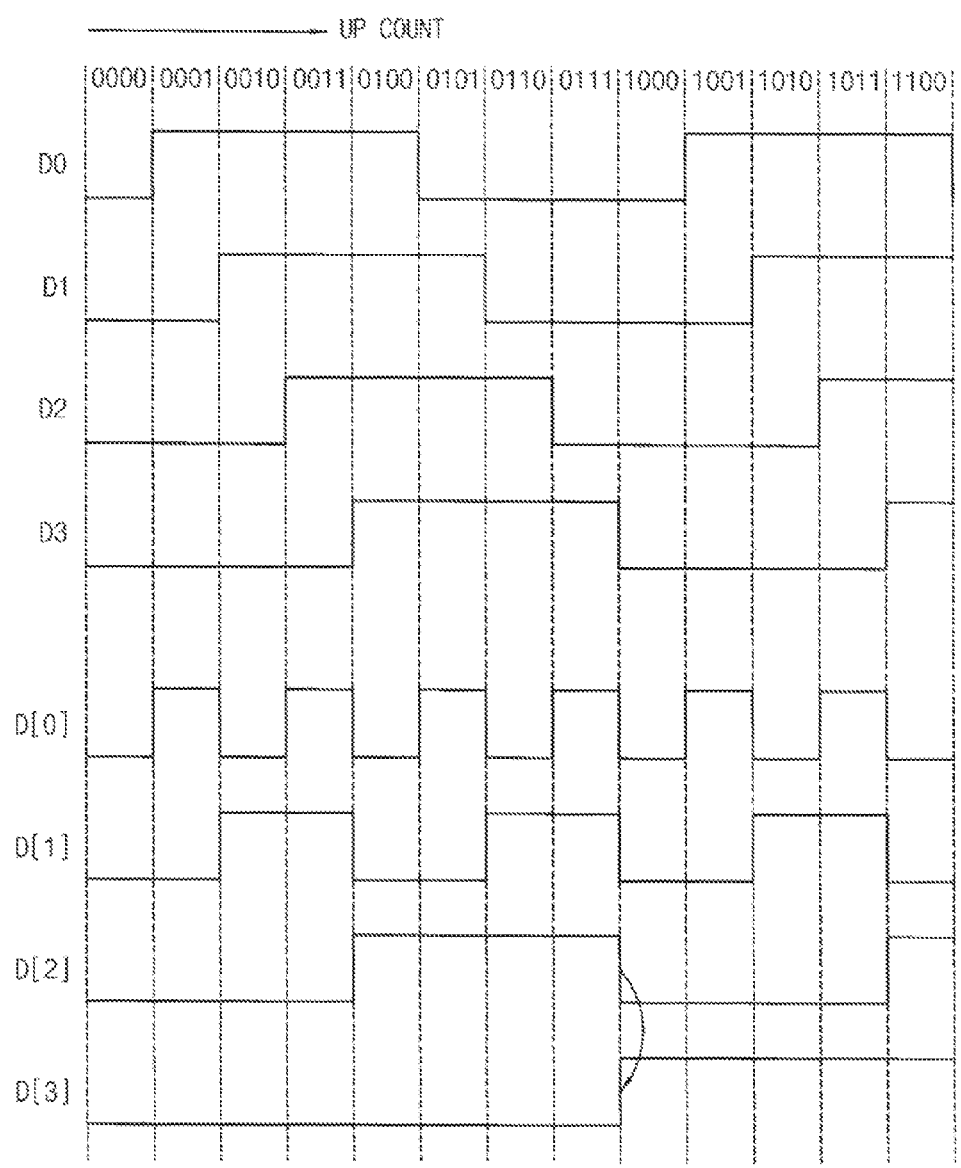
FIG. 26 is a timing diagram illustrating an up-counting operation of the counter of FIG. 25.

FIG. 25 is a block diagram illustrating a counter of a phase-division scheme according to an exemplary embodiment, and FIG. 26 is a timing diagram illustrating an up-counting operation of the counter of FIG. 25.

Referring to FIGS. 25 and 26, a counter 100f includes a buffer unit 10f and a ripple counter 30f. The buffer unit 10f may include a first counting unit 110f, a second counting unit 120f, a third counting unit 130f and a fourth counting unit 140f, and the ripple counter 30f may include a fifth counting unit 150f and a sixth counting unit 160f. In this exemplary embodiment, the gray bit signals in FIG. 2 may correspond to first, second, third and fourth gray bit signal D0, D1, D2 and D3, the less significant bit signals in FIG. 2 may correspond to first, second and third bit signals D[0], D[1] and D[2], the more significant bit signals in FIG. 2 may correspond to fourth and fifth bit signal D[3] and D[4]. The first counting unit 110f generates the first gray bit signal D0 by latching a first input clock signal CK1 at the end of a counting period (for example, a signal accumulation period), the second counting unit 120f generates the second gray bit signal D1 by latching a second input clock signal CK2 at the end of a signal accumulation period, the third counting unit 130f generates the third gray bit signal D2 by latching a third input clock signal CK3 at the end of a signal accumulation period, and the fourth counting unit 140f generates the fourth gray bit signal D3 by latching a fourth input clock signal CK4 at the end of a signal accumulation period.

In response to the latch output signal LOUT corresponding to the fourth gray bit signal D3, the ripple counter 30f generates the more significant bit signals, that is, the fourth bit signal D[3] and the fifth bit signal D[4] that are sequentially toggling. The latch output signal LOUT may be the fourth gray bit signal D3 or an inversion signal of the fourth gray bit signal D3 according to the configuration of the counter 100f.

The first through fourth gray bit signals D0 through D3 toggle during the counting operation and are latched signals of the first through fourth input clock signals CK1 through CK4 at the termination time point Te to provide the less significant bits D[0], D[1] and D[2] of the binary code D[0:4], that is, the digital count value corresponding to the count result.

The ripple counter 30f in the counter 110f may include an arbitrary number of counting units depending on the bit number of the digital value corresponding to the count result. Even though two counting units 150f and 160f are illustrated in FIG. 25 for convenience of description, the number of the counting units included in the ripple counter 30f may be changed according to the bit number of the binary code D[0:n]. Hereinafter, configurations and operations of the counter 100f are described referring to an exemplary embodiment in which the counter 100f generates the five bit signals D[0], D[1], D[2], D[3] and D[4], that is, the five-bit binary code D[0:4].

The ripple counter 30f has a cascade configuration such that the plurality of counting units 150f and 160f are sequentially coupled to toggle in response to an output signal of the previous counting unit. In other words, the fifth counting unit 150f may toggle in response to the latch output signal LOUT from the fourth counting unit 140f and the sixth counting unit 160f may toggle in response to the output signal OUT4 from the fifth counting unit 150f. As a result, the more significant bit signals, that is, the fourth bit signal D[3] and the fifth bit signal D[4] have respective cyclic periods that are sequentially doubled.

The counter 100f may include a logic unit, for example, a code converter 50f, that performs a logical operation on the first through fourth gray bit signals D0 through D3 to generate the first and second bit signals D[0] and D[1]. The fourth gray bit signal D3 itself may correspond to the third bit signal D[2]. The first though fourth gray bit signals D0 through D3 may provide three less significant bits of the count value but do not represent a straight binary code D[0:2], rather, the first through fourth gray bit signal D0 through D3 represent a gray code. The less significant bit signals D[0], D[1] and D[2] may be obtained, when required, by processing the gray code bits D0 through D3. The less significant bit signals D[0], D[1] and D[2] do not toggle during the counting operation, and may be provided by performing a logic operation on the latched first and second gray bit signals D0 through D3 after the counting operation is terminated. Accordingly, the code converter 50f may be located outside of the counter 100f, for example, in a chip other than the one in which the counter 100f is integrated.

As described with reference to FIGS. 25 and 26, the four gray bit signals D0, D1, D2 and D3 may be generated using the four counting units responding to the four input clock signals having the phases different from each other, and the three bit signals D[0], D[1] and D[2] of the binary code may be obtained by performing logic operations on the gray bit signals D0 through D3. Even though the four counting units are required to obtain the tree bits of the binary code, eight counts may be performed per the clock cycle of the input clock signals CK1 through CK4. Accordingly the embodiment of FIGS. 25 and 26 may be adopted if the counting speed is more important than the design margin (that is, more important than power restrictions, for example).

Figure 27:
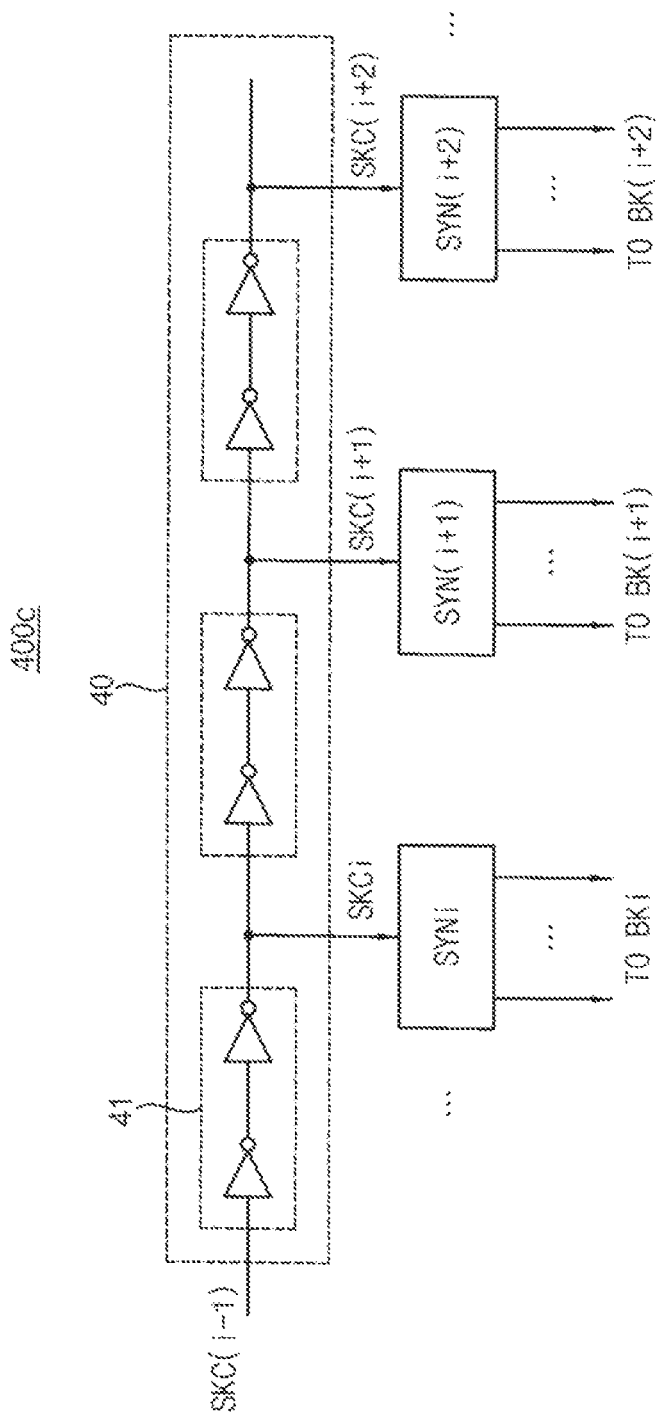
FIG. 27 is a block diagram illustrating an exemplary embodiment of a clock supply circuit included in the analog-to-digital converter of FIG. 1.

FIG. 27 is a block diagram illustrating an exemplary embodiment of a clock supply circuit such as may be included in the analog-to-digital converter of FIG. 1. In exemplary embodiments in accordance with principles of inventive concepts, clock supply circuit 400c may include a source clock transfer circuit 40 and a plurality of synchronization circuit SYNi, SYN(i+1) and SYN(i+2).

The source clock transfer circuit 40 may buffer the source clock signal SCK(i−1) to provide each of enforced source clock signals SCKi, SCK(i+1) and SCK(i+2) to each of the synchronization circuits SYNi, SYN(i+1) and SYN(i+2). As illustrated in FIG. 27, the source clock transfer circuit 40 may include buffers 41 implemented with a plurality of inverters. The inverters may be cascade-coupled with regular spacing. Using such inverters, the duty rate of the source clock signal may be maintained along a long transfer path, and the reliability of circuit operation may be secured.

The synchronization circuits SYNi, SYN(i+1) and SYN(i+2) may synchronize the input clock signal in response to the enforced source clock signals SCKi, SCK(i+1) and SCK(i+2) to provide the synchronized input clock signals to the counter banks BKi, BK(i+1) and BK(i+2), respectively.

Figure 28:
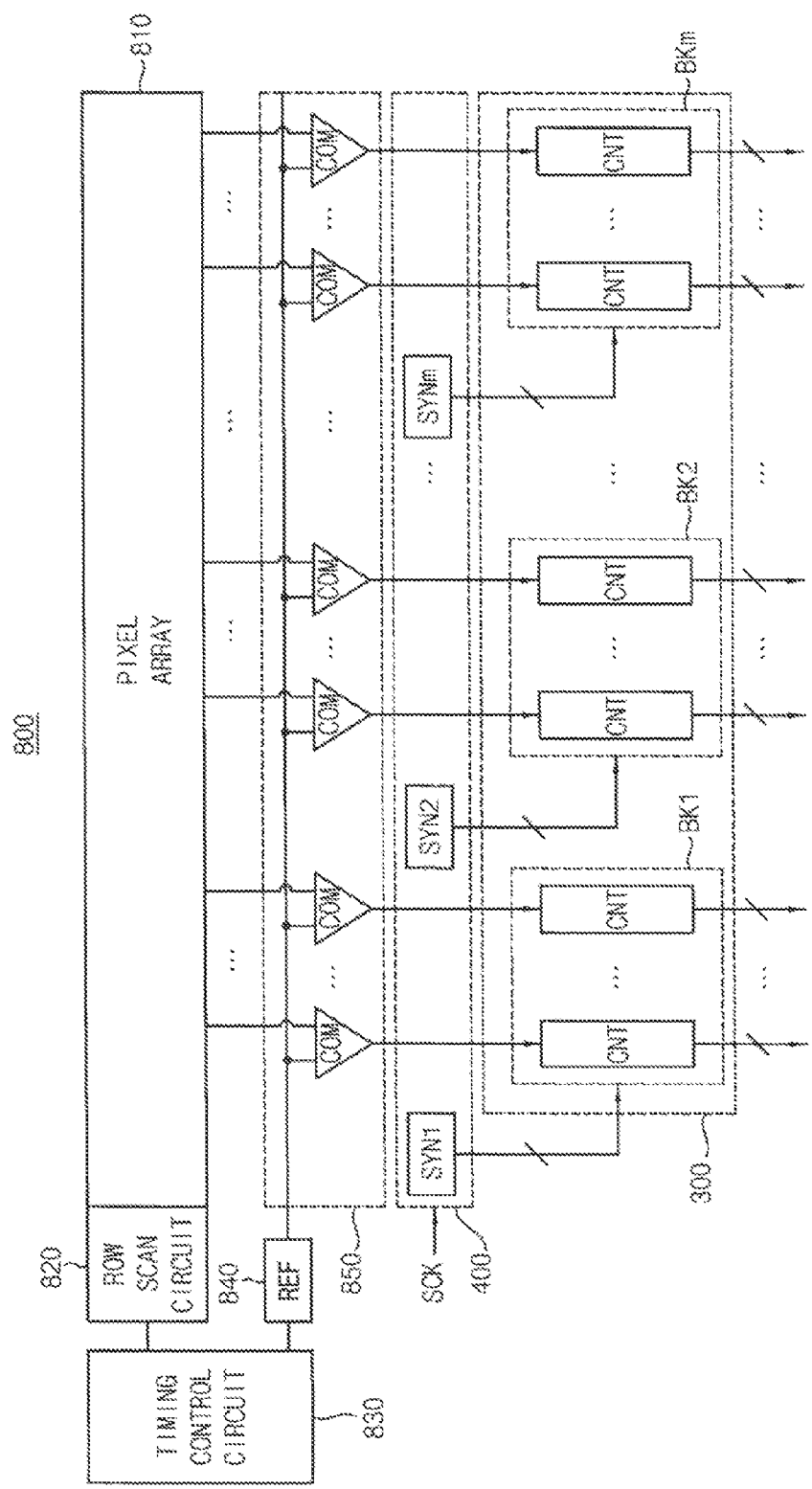
FIG. 28 is a block diagram illustrating an image sensor according to exemplary embodiments.

FIG. 28 is a block diagram illustrating an exemplary embodiment of an image sensor 800 in accordance with principles of inventive concepts. Image sensor 800 may include a pixel array 810, a comparison unit 850, a counter array 300 and a clock supply circuit 400. Image sensor 800 may also include a row scan circuit 820, a timing control circuit 830, a reference signal generator (REF) 840, and correlated double sampling (CDS) unit (not shown), and other circuitry, for example. Image sensor 800 may be a CCD image sensor or a CMOS image sensor, for example.

In an exemplary embodiment in accordance with principles of inventive concepts of a CMOS image sensor, the pixel array 810 includes a plurality of pixels for converting incident lights into electrical analog signals. In the image sensor including unit cells referred to as active pixels or gain cells, respective signal from each pixel is selected by address control of the pixels. The active pixel sensor is a kind of address-controlled image sensor, and the row scan circuit 830 controls operation of the pixel array 410 by unit of a row. The timing control circuit 830 generates control signals for controlling operations of the other components in the image sensor 800.

The analog signals detected by the pixel array 810 are converted into digital signals by an analog-to-digital converter (ADC) which includes the comparison unit 850 and the counter array 300. The analog signals may be output column by column, and the comparison unit 850 includes a plurality of comparators COMs configured to compare the analog signals with a reference signal from a reference signal generator 840 to generate comparison signals, respectively. The comparison signal may correspond to the input signal INP in the previous figures, for example.

The analog signals output from the pixel array 810 have variations in a reset component due to respective characteristic of each pixel referred to as a fixed pattern noise (FPN). That is, each pixel may produce a different signal value, even when all pixels are at a "zero" or, reset, signal input. Additionally, respective characteristic of each logic circuit for outputting a voltage signal from a corresponding pixel vary from one to another. Accordingly an effective signal component may be abstracted by subtracting the respective reset component from the measured signal component. As such, abstracting the effective signal component corresponding to the difference between the reset component and the measured signal component is referred to as correlated double sampling (CDS).

The CDS unit (not shown) may perform an analog double sampling (ADS) by obtaining the difference between the reset component and the measured signal component using capacitors and switches, and outputs analog signals corresponding to the effective signal components. The comparison unit 850 compares the analog signals output column by column from the CDS unit with the reference signal (for example, ramp signal RAMP) from the reference signal generator 840, and outputs comparison signals column by column. The comparison signals have respective transition timings according to respective effective signal component. In exemplary embodiments, each comparator output transitions when the reference signal RAMP reaches a level equal to the respective signal level presented to the comparison input of the comparator. A transition of the comparator output may stop a corresponding counter CNT, yielding a count output that represents the analog pixel signal value.

The counter array 300 includes a plurality of counters CNTs. Each counter CNT generates each of digital signals corresponding to each of analog signals by performing a counting operation based on a plurality of input clock signals CKi1 through CKip. The counters CNTs are grouped into a plurality of counter banks BK1 through BKm. For exemplary, as illustrated in FIG. 28, the counters CNTs may be grouped into the m counter banks BK1 through BKm. The number of counters in the respective counter banks may be different in some other exemplary embodiments.

The clock supply circuit 400 includes a plurality of synchronization circuits SYN1 through SYNm. Each synchronization circuit SYNi synchronizes the input clock signals in response to a source clock signal SCK to provide the synchronized input clock signals CKi1 through CKip to each counter group BKi. The input clock signals CK11 through CK1$p$ synchronized by the first synchronization circuit SYN1 are provided to the first counter bank BK1, the input clock signals CK21 through CK2$p$ synchronized by the second synchronization circuit SYN2 are provided to the second counter bank BK2, and the input clock signals CKm1 through CKmp synchronized by the second synchronization circuit SYNm are provided to the second counter bank BKm.

FIGS. 29 through 32 are circuit diagrams illustrating exemplary embodiments of a unit pixel such as may be included in the image sensor of FIG. 28 in accordance with principles of inventive concepts. The unit pixels PXa, PXb, PXc and PXd illustrated in FIGS. 29, 30, 31 and 32 may be a color pixel including a color photodiode or a depth pixel including a depth photodiode.

Figure 29:
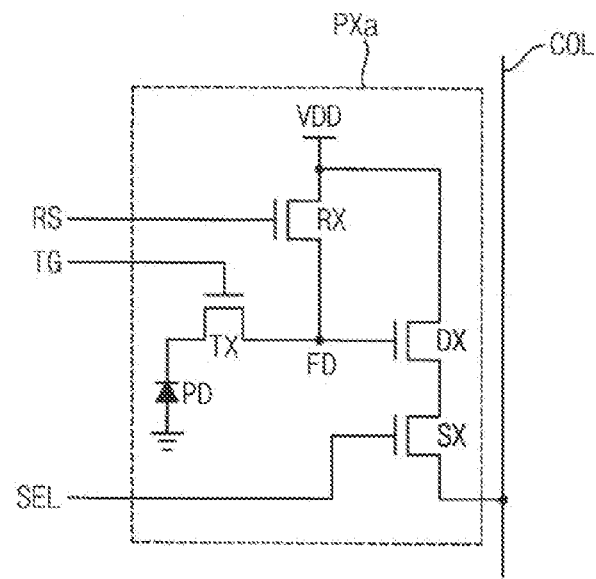
FIGS. 29 through 32 are circuit diagrams illustrating examples of a unit pixel included in the image sensor of FIG. 28.

Referring to FIG. 29, in exemplary embodiments in accordance with principles of inventive concepts, the unit pixel PXa may include a photo-sensitive element such as a photodiode PD, and a readout circuit including a transfer transistor TX, a reset transistor RX, a drive transistor DX, and a selection transistor SX.

For exemplary, the photodiode PD may include an n-type region in a p-type substrate such that the n-type region and the p-type substrate form a p-n conjunction diode. In operation photodiode PD receives incident light and generates a photo-charge based on the incident light. In some exemplary embodiments, the unit pixel PXa may include a photo transistor, a photo gate, a PIN photo diode, etc. instead of or in addition to the photodiode PD.

In exemplary embodiments in accordance with principles of inventive concepts, photo-charge generated in the photodiode PD may be transferred to a floating diffusion node FD through the transfer transistor TX, which is turned on in response to a transfer control signal TG. The drive transistor DX functions as a source follower amplifier that amplifies a signal corresponding to the charge on the floating diffusion node FD. The selection transistor SX may transfer the amplified signal to a column line COL in response to a selection signal SEL. The floating diffusion node FD may be reset by the reset transistor RX. The reset transistor RX may discharge the floating diffusion node FD in response to a reset signal RS for correlated double sampling (CDS).

Figure 30:
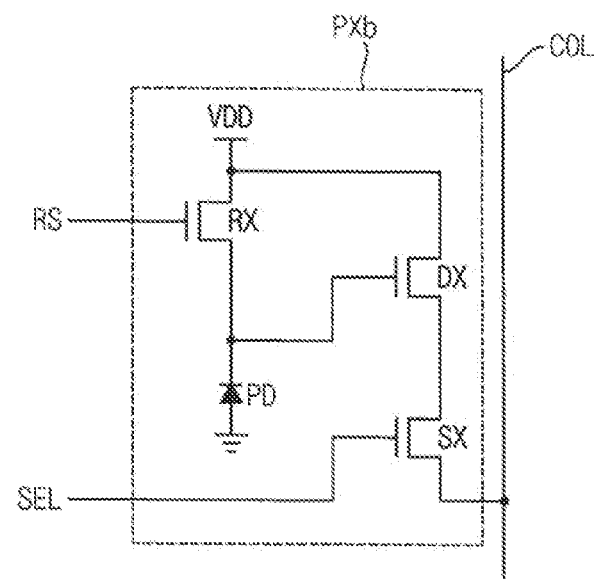
Figure 31:
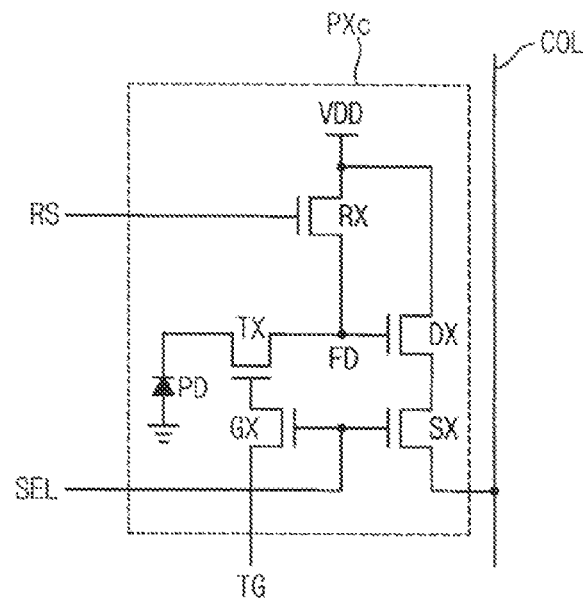
Figure 32:
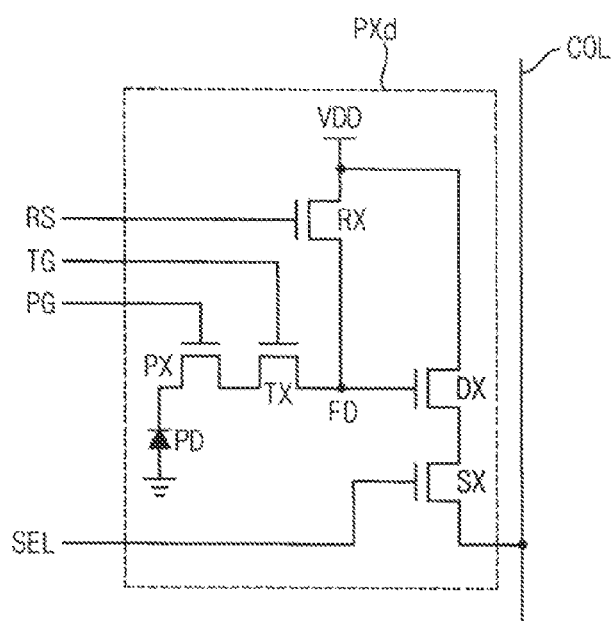

FIG. 29 illustrates an exemplary embodiment of unit pixel 200$a$ of the four-transistor configuration including the four transistors TX, RX, DX, and SX in accordance with principles of inventive concepts. The configuration of the unit pixel may be modified, as illustrated in FIGS. 30, 31, and 32, for example. Power is supplied via voltage supply terminal VDD and ground.

Referring to FIG. 30, the unit pixel PXb may have the three-transistor configuration including a photo-sensitive element such as a photodiode PD, and a readout circuit including a reset transistor RX, a drive transistor DX, and a selection transistor SX. Compared with the unit pixel PXa of FIG. 29, the transfer transistor TX is omitted in the unit pixel PXb of FIG. 30.

Referring to FIG. 31, the unit pixel PXc may have the five-transistor configuration including a photo-sensitive element such as a photodiode PD, and a readout circuit including a transfer transistor TX, a gate transistor GX, a reset transistor RX, a drive transistor DX, and a selection transistor SX. The gate transistor GX may selectively apply the transfer control signal TG to the transfer transistor TX in response to the selection signal SEL. Compared with the unit pixel PXa of FIG. 29, the gate transistor GX is further included in the unit pixel PXc of FIG. 31.

Referring to FIG. 32, the unit pixel PXd may have the five-transistor configuration including a photo-sensitive element such as a photodiode PD, and a readout circuit including a photo transistor PX, a transfer transistor TX, a reset transistor RX, a drive transistor DX, and a selection transistor SX. The photo transistor PX may be turned on or off in response to a photo gate signal PG. The unit pixel PXd may enabled when the photo transistor PX is turned on and disabled when the photo transistor PX is turned off. Compared with the unit pixel PXa of FIG. 29, the photo transistor PX is further included in the unit pixel PXd of FIG. 32.

Figure 33:
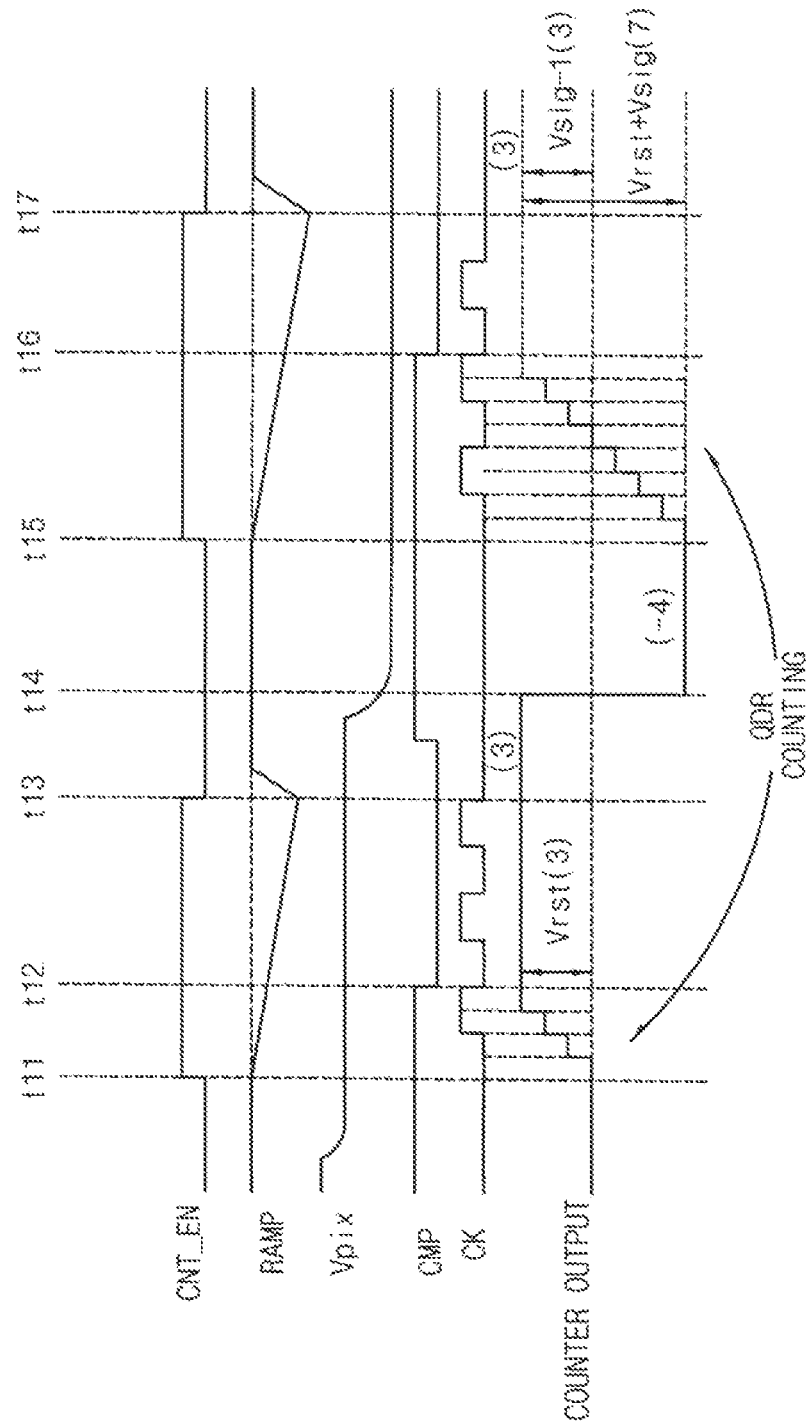
FIG. 33 is a timing diagram illustrating a correlated double sampling (CDS) operation in an image sensor including a counter of an inversion function.

FIG. 33 is a timing diagram illustrating a correlated double sampling (CDS) operation in an image sensor in accordance with principles of inventive concepts, including a counter of an inversion function. FIG. 33 illustrates an exemplary embodiment of a digital CDS operation with respect to one column.

Referring to FIGS. 28 and 33, at time t11, the count enable signal CNT_EN from the timing control circuit 830 is activated to logic high, and the reference signal generator 840 decreases the voltage level of the ramp signal RAMP and the first counting operation begins column by column in the respective counters CNTs. The pixel voltage signal Vpix is provided to the comparator COM as the first analog signal indicating the reset component (that is, a reset value corresponding to a zero level input image signal).

At time t12, the voltage levels of the ramp signal RAMP and the pixel voltage signal Vpix become equal to each other (that is, RAMP falls to the level of Vpix), and the comparison signal CMP of the comparator 661 transitions to logic low, which indicates the termination time point of the first counting operation. In response to the falling edge of the comparison signal CMP, the first count result (Vrst=3) corresponding to the reset component (that is, the digitized value corresponding to a zero level input image signal) is stored in the counter CNT.

At time t13, the count enable signal CNT_EN is deactivated to logic low and the reference signal generator 840 is disabled. The time interval from t11 to t13 corresponds to a maximum time for counting the reset component, which may be determined as the appropriate number of clock cycles according to characteristic of the image sensor in accordance with principles of inventive concepts.

At time t14, the bit values stored in the counter CNT are inverted by a inversion control unit that may be included in the counter CNT. The inversion result (for exemplary, −4) is stored in the counter 100k.

At time t15, the count enable signal CNT_EN from the timing control circuit 830 is activated again to logic high, and the reference signal generator 840 decreases the voltage level of the ramp signal RAMP. The slopes of the ramp signal RAMP during the second counting operation may be the same as the slope during the first counting operation and the second counting operation begins column by column in the respective counters CNTs. The pixel voltage signal Vpix is provided to the comparator COM as the second analog signal, indicating the measured image component.

At time t16, the voltage levels of the ramp signal RAMP and the pixel voltage signal Vpix become equal to each other, and the comparison signal CMP of the comparator COM transitions to logic low, which indicates the termination time point of the second counting operation. In response to the falling edge of the comparison signal CMP, the difference (Vsig−1=3) between the first analog signal indicating the reset component (Vrst=3) and the second analog signal indicating the measured image component (Vrst+Vsig=7) is stored in the counter CNT. The finally-stored value (Vsig−1=3) is output as the digital signal represented by the first through fourth bit signals.

At time t17, the count enable signal CNT_EN is deactivated to logic low and the reference signal generator 840 is disabled. The time interval from t15 to t17 corresponds to a maximum time for counting the measured image component, which may be determined as the appropriate number of clock cycles according to characteristic of the image sensor in accordance with principles of inventive concepts.

In accordance with principles of inventive concepts, the image sensor may perform digital CDS using the QDR counter having the inversion function. In this case, the first counting operation between t11 through t12 and the second counting operation between t15 through t16 may be performed as the QDR counting, thereby enhancing the operation speed and the operation margin of the image sensor and reducing power consumption.

Figure 34:
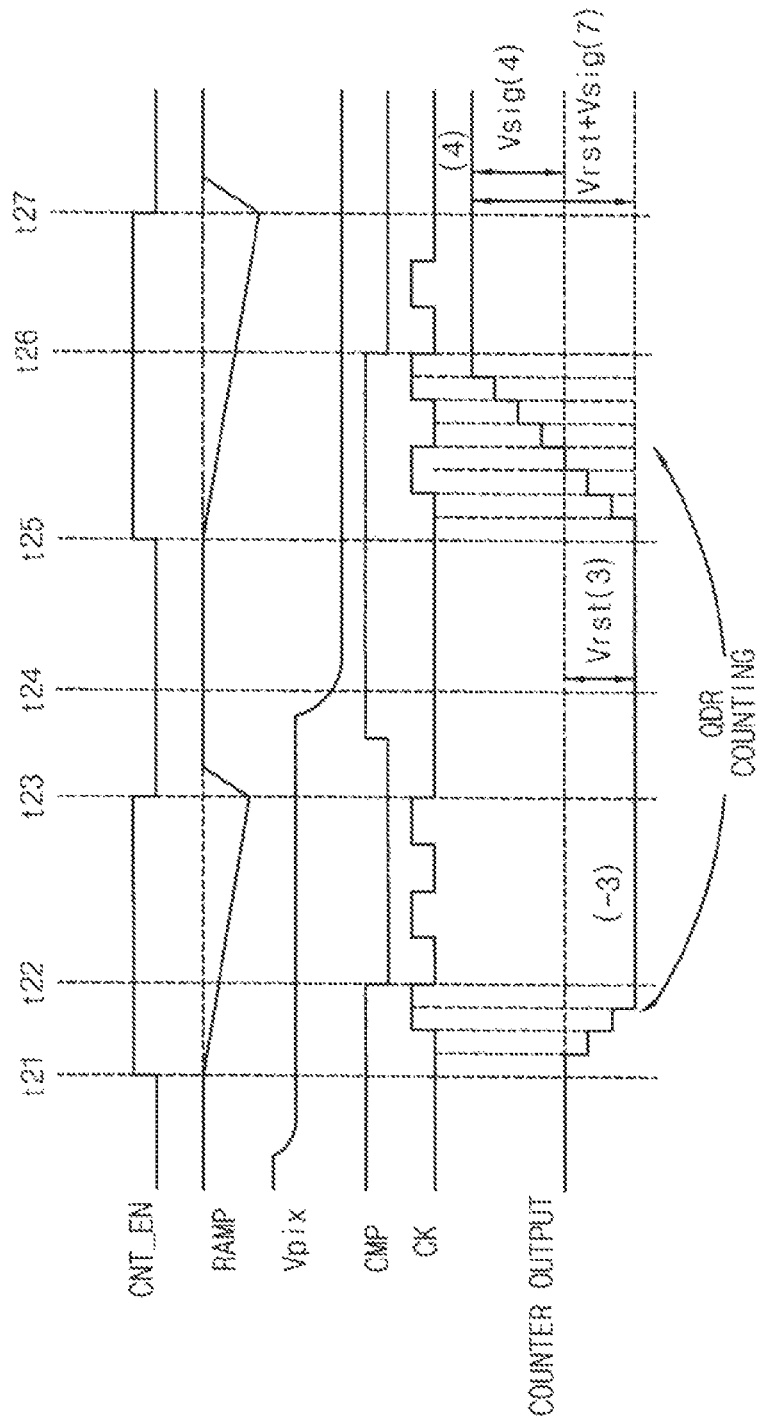
FIG. 34 is a timing diagram illustrating a CDS operation in an image sensor including a counter of an up-down conversion function.

FIG. 34 is a timing diagram illustrating a CDS operation in an image sensor in accordance with principles of inventive concepts including a counter of an up-down conversion function. FIG. 34 illustrates the digital CDS operation with respect to one column.

Referring to FIGS. 28 and 34, at time t21, the count enable signal CNT_EN from the control circuit 830 is activated to logic high, and the reference signal generator 840 decreases the voltage level of the ramp signal RAMP and the first counting operation, that is, the down-counting operation, begins column by column in the respective counters CNTs. The pixel voltage signal Vpix is provided to the comparator COM as the first analog signal indicating the reset component.

At time t22, the voltage levels of the ramp signal RAMP and the pixel voltage signal Vpix become equal to each other, and the comparison signal CMP of the comparator COM transitions to logic low, which indicates the termination time point of the first counting operation. In response to the falling edge of the comparison signal CMP, the first count result (−3) corresponding to the reset component (Vrst=3) is stored in the counter CNT.

At time t23, the count enable signal CNT_EN is deactivated to logic low and the reference signal generator 840 is disabled. The time interval from t21 to t23 corresponds to a maximum time for counting the reset component, which may be determined as the appropriate number of clock cycles according to characteristic of the image sensor in accordance with principles of inventive concepts.

At time t24, the processes for conversion from the down-counting operation to the up-counting operation are performed using the up-down conversion control unit that may be included in the counter CNT, for example.

At time t25, the count enable signal CNT_EN from the timing control circuit 830 is activated again to logic high, and the reference signal generator 840 decreases the voltage level of the ramp signal RAMP. The slopes of the ramp signal RAMP during the second counting operation may be the same as the slope during the first counting operation, for example, and the second counting operation, that is, the up-counting operation begins column by column in the respective counters CNT. The pixel voltage signal Vpix is provided to the comparator COM as the second analog signal indicating the measured image component.

At time t26, the voltage levels of the ramp signal RAMP and the pixel voltage signal Vpix become equal to each other, and the comparison signal CMP of the comparator COM transitions to logic low, which indicates the termination time point of the second counting operation. In response to the falling edge of the comparison signal CMP, the difference (Vsig=4) between the first analog signal indicating the reset component (Vrst=3) and the second analog signal indicating the measured image component (Vrst+Vsig=7) is stored in the counter CNT. The finally stored value (Vsig=3) is output as the digital signal represented by the bit signals.

At time t27, the count enable signal CNT_EN is deactivated to logic low and the reference signal generator 840 is disabled. The time interval from t25 to t27 corresponds to a maximum time for counting the measured image component, which may be determined as the appropriate number of clock cycles according to characteristic of the image sensor in accordance with principles of inventive concepts.

In accordance with principles of inventive concepts, the image sensor may perform digital CDS using the QDR counter having the up-down conversion function. In such embodiments, the first counting operation between t21 through t22 and the second counting operation between t25 through t26 may be performed as the QDR counting, thereby enhancing the operation speed and the operation margin of the image sensor and reducing power consumption.

Figure 35:
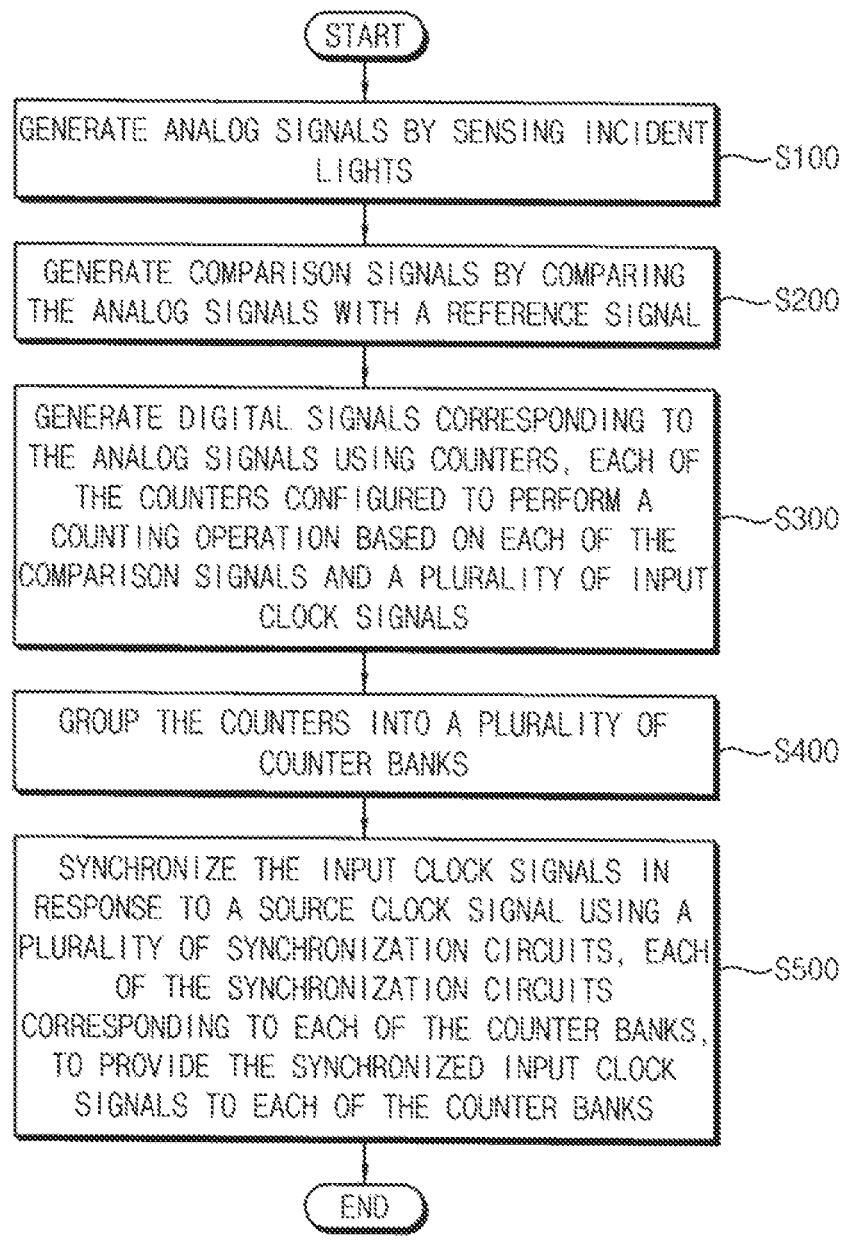
FIG. 35 is a flowchart illustrating a method of operating an image sensor according to exemplary embodiments.

FIG. 35 is a flowchart illustrating a method of operating an image sensor according to exemplary embodiments in accordance with principles of inventive concepts.

Referring to FIGS. 28 and 35, analog signals may be generated by sensing incident lights (S100) using pixel array 810. The analog signals may be provided in parallel using a plurality of column lines, for example. Using the comparators COMs that are coupled to the respective column lines, comparison signals may be generated by comparing the analog signals with a reference signal, for example, a ramp signal (S200). Using the counters CNTs configured to perform a counting operation based on each of the comparison signals and a plurality of input clock signals, digital signals corresponding to the analog signals may be generated (S300). In exemplary embodiments in accordance with principles of inventive concepts, counters CNTs are grouped into a plurality of counter banks BK1 through BKm (S400). Using a plurality of synchronization circuits SYN1 through SYNm, the input clock signals are synchronized in response to a source clock signal SCK (S500) to provide the synchronized input clock signals to each of the counter banks BK1 through BKm (S500).

In exemplary embodiments in accordance with principles of inventive concepts, the counting operations may be performed by providing the synchronized input clock signals to the respective counter banks BK1 through BKm using the synchronization circuits SYN1 through SYNm. The power consumption may be reduced, in accordance with principles of inventive concepts, by using the source clock signal SCK having the higher frequency only in synchronizing the input clock signals and using the input clock signals having the lower frequency in the counting operation. Additionally, in accordance with principles of inventive concepts, the speed of the counting operation may be readily increased because limits to the frequency of the input clock signals are relieved by separating the source clock signal SCK and the input clock signals.

Figure 36:
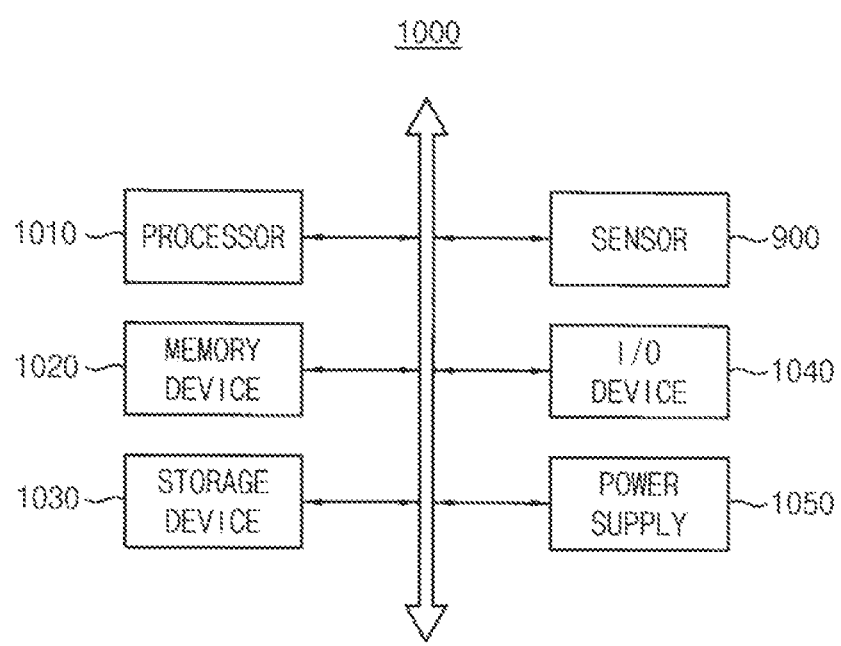
FIG. 36 is a block diagram illustrating a computer system including an image sensor according to exemplary embodiments.

FIG. 36 is a block diagram illustrating a computer system including an image sensor according to exemplary embodiments in accordance with principles of inventive concepts. Computing system 1000 may include a processor 1010, a memory device 1020, a storage device 1030, an input-output (I/O) device 1040, a power supply 1050, and an image sensor 900. Although it is not illustrated in FIG. 36, the computing system 1000 may further include ports that communicate with a video card, a sound card, a memory card, a universal serial bus (USB) device, and/or other electronic devices, for example.

The processor 1010 may perform various calculations or tasks. According to some embodiments, the processor 1010 may be a microprocessor or a central processing unit (CPU). The processor 1010 may communicate with the memory device 1020, the storage device 1030, and the input/output device 1040 via an address bus, a control bus, and/or a data bus. In some exemplary embodiments, the processor 1010 may be coupled to an extended bus, such as a peripheral component interconnection (PCI) bus. The memory device 1020 may store data for operating the computing system 1000. In exemplary embodiments in accordance with principles of inventive concepts, the memory device 1020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device, for example. The storage device may include a solid state drive (SSD), a hard disk drive (HDD), a compact-disc read-only memory (CD-ROM), etc. The input/output device 1040 may include an input device (for example, a keyboard, a keypad, a mouse, etc.) and an output device (for example, a printer, a display device, etc.). The power supply 1050 supplies operation voltages for the computing system 1000.

The image sensor 900 includes the counter array 300 grouped in the counter banks BK1 through BKm and the clock supply circuit 400 including the synchronization circuits SYN1 through SYNm for provided the synchronized input clock signals to the counter banks BK1 through BKm, respectively, as described with reference to FIG. 28. The image sensor 900 may communicate with the processor 1010 via the buses or other communication links. The image sensor 900 may be integrated with the processor 1010 in one chip, or the image sensor 900 and the processor 1010 may be implemented as separate chips.

The computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP), for example.

The computing system 1000 may be any computing system using an image sensor. For example, the computing system 1000 may include a digital camera, a mobile phone, a smart phone, a portable multimedia player (PMP), a personal digital assistant (PDA), etc.

FIG. 37 illustrates a block diagram of an interface employable in the computing system of FIG. 36 according to some exemplary embodiments.

Referring to FIG. 37, a computing system 1100 may be implemented by a data processing device that uses or supports a mobile industry processor interface (MIPI®) interface. The computing system 1100 may include an application processor 1110, an image sensor such as a three-dimensional image sensor 1140, a display device 1150, etc. A CSI host 1112 of the application processor 1110 may perform a serial communication with a CSI device 1141 of the three-dimensional image sensor 1140 via a camera serial interface (CSI). In some exemplary embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In exemplary embodiments in accordance with principles of inventive concepts, image sensor 1140 includes counter array 300 grouped in the counter banks BK1 through BKm and clock supply circuit 400 including the synchronization circuits SYN1 through SYNm for provided the synchronized input clock signals to the counter banks BK1 through BKm, respectively, as described with reference to FIG. 28.

In some exemplary embodiments, the DSI host 1111 may include a serializer (SER), and the DSI device 1151 may include a deserializer (DES). The computing system 1100 may further include a radio frequency (RF) chip 1160 performing a communication with the application processor 1110 and a DigRFSM slave 1162 providing communication with other devices. A physical layer (PHY) 1113 of the computing system 1100 and a physical layer (PHY) 1161 of the RF chip 1160 may perform data communications based on a MIPI® DigRFSM. The application processor 1110 may further include a DigRFSM MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra-wideband (UWB) 1210, a wireless local area network (WLAN) 1220, a worldwide interoperability for microwave access (WIMAX) 1230, etc. However, the structure and the interface of the computing system 1100 are not limited thereto.

As described above, in accordance with principles of inventive concepts, counting operations may be performed by providing synchronized input clock signals to respective counter banks BK1 through BKm using the synchronization circuits SYN1 through SYNm. The power consumption may be reduced by using source clock signal SCK having a higher frequency only in synchronizing the input clock signals and using the input clock signals having a lower frequency in the counting operation. Additionally, the speed of the counting operation may be readily increased because limits to the frequency of the input clock signals are relieved by separating the source clock signal SCK and the input clock signals.

Inventive concept may be applied to systems such as a memory card, a solid state drive (SSD), a mobile phone, a smart phone, a personal digital assistant (PDA), a portable multimedia player (PMP), a digital camera, a music player, a portable game console, a navigation system, for example.

The foregoing is illustrative of exemplary embodiments and is not to be construed as limiting thereof. Although exemplary embodiments have been described, those skilled in the art will readily appreciate that many modifications are possible in the exemplary embodiments without materially departing from the novel teachings and advantages of inventive concepts. Accordingly, all such modifications are intended to be included within the scope of inventive concepts as defined in the claims.

What is claimed is:

1. An image sensor comprising:
 a pixel array including a plurality of pixels configured to generate analog signals by sensing incident lights;
 a plurality of comparators configured to generate comparison signals by comparing the analog signals with a reference signal;
 a plurality of counters that are grouped into a plurality of counter groups, the counters in each counter group configured to generate digital signals corresponding to the analog signals by counting under control of the comparison signals and input clock signals for each counter group; and
 a plurality of synchronization circuits, each configured to synchronize the input clock signals in response to a source clock signal to provide synchronized input clock signals for each counter group of the counter groups.

2. The image sensor of claim 1, wherein the input clock signals have the same frequency, but phase differences with respect to one another.

3. The image sensor of claim 2, wherein each of the counters is configured to count four or more times per cyclic period of the input clock signals, using phase differences of the input clock signals.

4. The image sensor of claim 2, wherein the source clock signal has a frequency higher than a frequency of the input clock signals.

5. The image sensor of claim 1, wherein the synchronization circuits include a plurality of retimers that are cascade-coupled to sequentially transfer the input clock signals in response to the source clock signal.

6. The image sensor of claim 5, wherein each of the retimers is configured to receive the input clock signals from a main clock generator or a previous one of the plurality of retimers and configured to rearrange the received input clock signals in response to the source clock signal to generate the synchronized input clock signals.

7. The image sensor of claim 1, wherein the synchronization circuits include a plurality of local clock generators, each of the local clock generators configured to generate the input clock signals in response to the source clock signal.

8. The image sensor of claim 1, further comprising:
 a source clock transfer circuit configured to buffer the source clock signal to provide each of enforced source clock signals to each of the synchronization circuits.

9. The image sensor of claim 8, wherein the source clock transfer circuit includes a plurality of inverters that are cascade-coupled with regular spacing.

10. The image sensor of claim 1, wherein the input clock signals include a first input clock signal and a second input clock signal having the same frequency, and
 wherein a phase of the second input clock signal lags behind a phase of the first input clock signal by 90 degrees.

11. The image sensor of claim 10, wherein each of the synchronization circuits includes:
 a first flip-flop including a data terminal receiving the first input clock signal, a clock terminal receiving the source clock signal and an output terminal generating a first synchronized input clock signal; and
 a second flip-flop including a data terminal receiving the second input clock signal, a clock terminal receiving an inversion signal of the source clock signal and an output terminal generating a second synchronized input clock signal.

12. The image sensor of claim 10, wherein each of the synchronization circuits includes:
 a first toggling flip-flop configured to generate the first input clock signal in synchronization with rising edges of the source clock signal; and
 a second toggling flip-flop configured to generate the second input clock signal in synchronization with falling edges of the source clock signal.

13. The image sensor of claim 10, wherein each of the counters is configured to count four times per cyclic period of the first and second input clock signals, using a phase difference of the first and second input clock signals.

14. The image sensor of claim 1, wherein the input clock signals include a first input clock signal, a second input clock signal, a third input clock signal and a fourth input clock signal having the same frequency, and
 wherein a phase of the second input clock signal lags behind a phase of the first input clock signal by 45 degrees, a phase of the third input clock signal lags behind the phase of the second input clock signal by 45 degrees, and a phase of the fourth input clock signal lags behind the phase of the third input clock signal by 45 degrees.

15. The image sensor of claim 14, wherein each of the synchronization circuits includes:
 a first toggling flip-flop configured to generate a first toggling signal in synchronization with rising edges of the source clock signal;
 a second toggling flip-flop configured to generate a second toggling signal in synchronization with falling edges of the source clock signal;
 a third toggling flip-flop configured to generate the first input clock signal in synchronization with rising edges of the first toggling signal;

a fourth toggling flip-flop configured to generate the second input clock signal in synchronization with rising edges of the second toggling signal;
a fifth toggling flip-flop configured to generate the third input clock signal in synchronization with falling edges of the first toggling signal; and
a sixth toggling flip-flop configured to generate the fourth input clock signal in synchronization with falling edges of the second toggling signal.

16. The image sensor of claim 14, wherein each of the counters is configured to use phase differences among the first through fourth input clock signals to count eight times per cyclic period of the first through fourth input clock signals.

17. The image sensor of claim 1, wherein each of the counters includes;
a buffer unit configured to generate a plurality of gray code bit signals by latching the input clock signals in response to each of the comparison signals indicating an end of a counting operation; and
a ripple counter configured to generate more significant bit signals of a count value in response to a latch output signal, the latch output signal corresponding to one of the gray code bit signals.

18. The image sensor of claim 17, wherein each of the counters further includes;
a code converter configured to perform a logical operation on the gray code bit signals to generate less significant bit signals of the count value.

19. An analog-to-digital converter comprising:
a plurality of counters that are grouped into a plurality of counter groups, the counters in each group configured to generate digital signals corresponding to analog signals by counting under control of an input clock signal for each group; and
a plurality of synchronization circuits, each configured to synchronize the input clock signals in each counter group in response to a source clock signal to provide synchronized input clock signals to each of the counter groups.

20. A method of operating an image sensor, comprising:
generating analog signals by sensing incident lights;
generating comparison signals by comparing the analog signals with a reference signal;
generating digital signals corresponding to the analog signals using groups of counters, each of the counters in a group of counters configured to count under control of the comparison signals and an input clock signal for each group;
grouping the counters into a plurality of counter banks; and
synchronizing the input clock signals with a source clock signal using a plurality of synchronization circuits, each of the synchronization circuits corresponding to a counter bank, to provide synchronized input clock signals to each of the counter banks.

* * * * *